(12) United States Patent
Hitora et al.

(10) Patent No.: US 9,590,050 B2
(45) Date of Patent: Mar. 7, 2017

(54) CRYSTALLINE MULTILAYER STRUCTURE AND SEMICONDUCTOR DEVICE

(71) Applicant: FLOSFIA INC., Kyoto-shi, Kyoto (JP)

(72) Inventors: Toshimi Hitora, Kyoto (JP); Masaya Oda, Kyoto (JP); Akio Takatsuka, Kyoto (JP)

(73) Assignee: FLOSFIA, INC., Kyoto (JP)

( * ) Notice: Subject to any disclaimer, the term of this patent is extended or adjusted under 35 U.S.C. 154(b) by 0 days.

(21) Appl. No.: 14/578,072

(22) Filed: Dec. 19, 2014

(65) Prior Publication Data

US 2015/0325660 A1    Nov. 12, 2015

(30) Foreign Application Priority Data

May 8, 2014  (JP) ................. 2014-097241

(51) Int. Cl.
*H01L 21/00*  (2006.01)
*H01L 29/22*  (2006.01)
(Continued)

(52) U.S. Cl.
CPC .......... *H01L 29/22* (2013.01); *H01L 21/0257* (2013.01); *H01L 21/0262* (2013.01);
(Continued)

(58) Field of Classification Search
CPC ......... H01L 33/16; H01L 33/18; H01L 29/04; H01L 29/12; H01L 29/24; H01L 29/26; H01L 21/02609
See application file for complete search history.

(56) References Cited

U.S. PATENT DOCUMENTS

2003/0122147 A1* 7/2003 Sheu .............. H01L 33/04
257/103
2004/0185251 A1* 9/2004 Wang .............. B82Y 30/00
428/397
(Continued)

FOREIGN PATENT DOCUMENTS

CN    101931009 A    12/2010
JP    2011-029399 A   2/2011
(Continued)

OTHER PUBLICATIONS

Machine Translation of JP2012-256850, Dec. 27, 2013, Watanabe et al.*

(Continued)

*Primary Examiner* — Zandra Smith
*Assistant Examiner* — Evan Clinton
(74) *Attorney, Agent, or Firm* — Christensen O'Connor Johnson Kindness PLLC

(57) ABSTRACT

Provided is a crystalline multilayer structure having good semiconductor properties. In particular, the crystalline multilayer structure has good electrical properties as follows: the controllability of conductivity is good; and vertical conduction is possible. A crystalline multilayer structure includes a metal layer containing a uniaxially oriented metal as a major component and a semiconductor layer disposed directly on the metal layer or with another layer therebetween and containing a crystalline oxide semiconductor as a major component. The crystalline oxide semiconductor contains one or more metals selected from gallium, indium, and aluminum and is uniaxially oriented.

13 Claims, 13 Drawing Sheets

(51) Int. Cl.

| | | |
|---|---|---|
| *H01L 33/28* | (2010.01) | |
| *H01L 21/02* | (2006.01) | |
| *H01L 29/772* | (2006.01) | |
| *H01L 29/778* | (2006.01) | |
| *H01L 29/812* | (2006.01) | |
| *H01L 29/04* | (2006.01) | |
| *H01L 29/24* | (2006.01) | |
| *H01L 29/66* | (2006.01) | |
| *H01L 29/808* | (2006.01) | |
| *H01L 29/872* | (2006.01) | |
| *H01L 29/10* | (2006.01) | |
| *H01L 33/26* | (2010.01) | |
| *H01L 33/42* | (2010.01) | |

(52) U.S. Cl.
CPC .. *H01L 21/02491* (2013.01); *H01L 21/02565* (2013.01); *H01L 29/04* (2013.01); *H01L 29/1066* (2013.01); *H01L 29/24* (2013.01); *H01L 29/66969* (2013.01); *H01L 29/7722* (2013.01); *H01L 29/7786* (2013.01); *H01L 29/8083* (2013.01); *H01L 29/812* (2013.01); *H01L 29/872* (2013.01); *H01L 33/28* (2013.01); *H01L 33/26* (2013.01); *H01L 33/42* (2013.01); *H01L 2933/0016* (2013.01)

(56) References Cited

U.S. PATENT DOCUMENTS

| | | | |
|---|---|---|---|
| 2005/0199967 A1* | 9/2005 | Hoffman | ............ H01L 29/7869 257/411 |
| 2008/0210951 A1 | 9/2008 | Jiang | |
| 2010/0320459 A1 | 12/2010 | Umeda et al. | |
| 2012/0261657 A1 | 10/2012 | Takahashi et al. | |
| 2013/0240874 A1 | 9/2013 | Maekawa | |

FOREIGN PATENT DOCUMENTS

| | | | | |
|---|---|---|---|---|
| JP | 2011-192975 | A | 9/2011 | |
| JP | 2012-256850 | A | 12/2012 | |
| JP | 2012-256851 | A | 12/2012 | |
| JP | 2013-058636 | A | 3/2013 | |
| JP | 5528612 | B * | 6/2014 | ........... H01L 21/365 |
| JP | 5528612 | B1 * | 6/2014 | |
| TW | 201249752 | A1 | 12/2012 | |
| WO | 2007/056956 | A1 | 5/2007 | |
| WO | 2013/035842 | A1 | 3/2013 | |
| WO | 2013/035844 | A1 | 3/2013 | |

OTHER PUBLICATIONS

Chung, J.W., et al., "Seamless On-Wafer Integration of Si(100) MOSFETs and GaN HEMTs," IEEE Electron Device Letters 30(10):1015-1017, Oct. 2009.

Kaneko, K., "Growth and Physical Properties of Corundum-Structured Gallium Oxide Alloy Thin Films," doctoral dissertation (abstract), Kyoto University, Kyoto, Mar. 25, 2013, 4 pages.

Wilson, K., et al., "Electronic, Structural, and Reactive Properties of Ultrathin Aluminum Oxide Films on Pt(111)," Journal of Physical Chemistry B 102(10):1736-1744, Mar. 1998.

Taiwanese Office Action mailed Apr. 12, 2016, issued in corresponding Taiwanese Application No. 104114711, filed May 8, 2015, 6 pages.

Extended European Search Report, mailed Sep. 30, 2015, issued in corresponding EP Application No. 14 199 110.9, 6 pages.

* cited by examiner

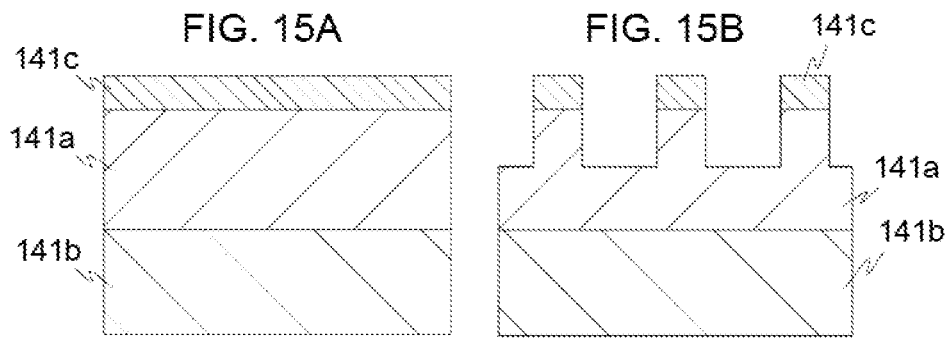
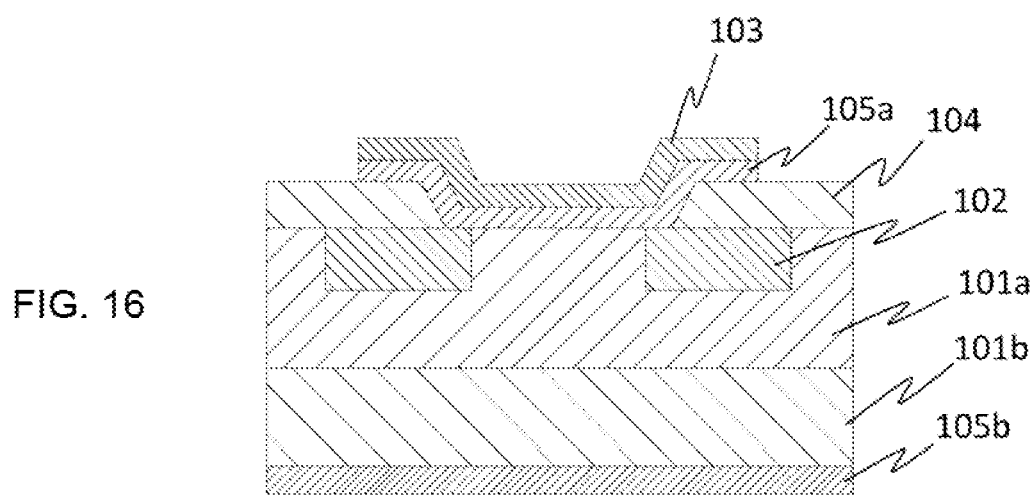
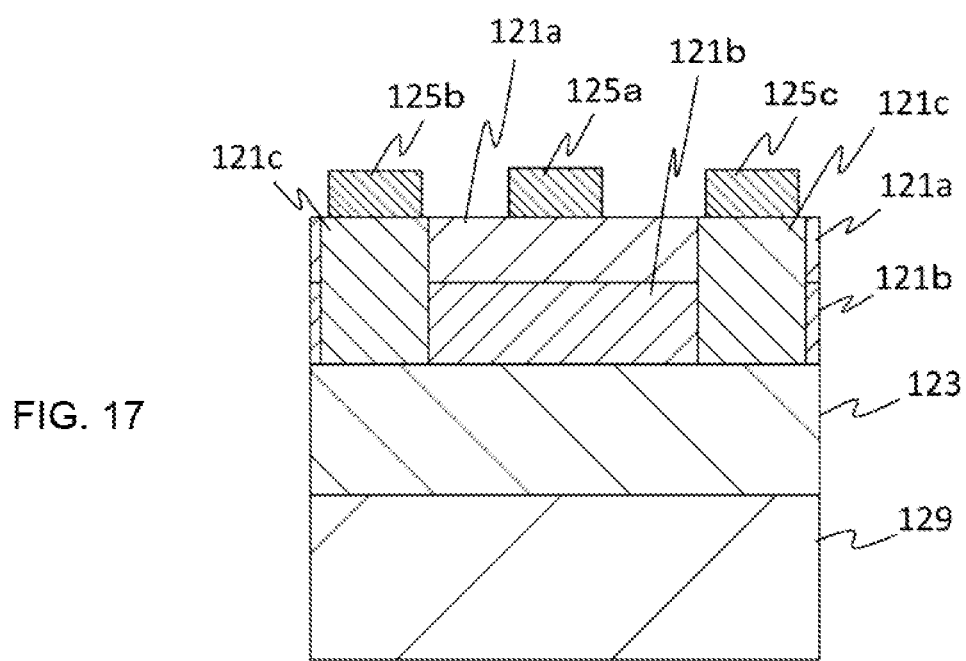

CRYSTALLINE MULTILAYER STRUCTURE AND SEMICONDUCTOR DEVICE

TECHNICAL FIELD

The present invention relates to a crystalline multilayer structure which is useful for semiconductor devices, in particular, power or light-receiving/emitting semiconductor devices and a semiconductor device including the crystalline multilayer structure.

BACKGROUND ART

Semiconductor devices including gallium oxide ($Ga_2O_3$), which has a large band gap, are receiving attention as next-generation switching devices capable of achieving high voltage, low loss, and high heat resistance. Such semiconductor devices are expected to be applied to power semiconductor apparatuses, such as inverters. Also, thanks to their wide band gaps, these semiconductor devices are expected to be applied to light-receiving/emitting devices, such as LEDs and sensors. According to Non-Patent Literature 1 (Kentaro Kaneko, "Growth and Physical Properties of Corundum-Structured Gallium Oxide-Based Mixed Crystal Thin Film," Kyoto University doctoral dissertation, March, 2013), the band gaps of mixed crystals formed by mixing indium or aluminum or both with gallium oxide can be controlled, and such mixed crystals form an extremely attractive material system as InAlGaO-based semiconductors. As used herein, InAlGaO-based semiconductors refer to $In_XAl_YGa_ZO_3$ ($0 \leq X \leq 2$, $0 \leq Y \leq 2$, $0 \leq Z \leq 2$, $X+Y+Z=1.5$ to $2.5$) semiconductors and can be regarded as a system of materials each containing gallium oxide.

SUMMARY OF INVENTION

A gallium oxide substrate or sapphire substrate has been used as a base substrate to realize semiconductor devices containing an InAlGaO-based semiconductor.

According to Patent Literature 1 (International Publication No. 2013/035842), use of a β gallium oxide substrate allows homoepitaxial growth of gallium oxide, thus can increase the quality of an aluminum oxide gallium thin film. However, β gallium oxide substrates are limited in their available sizes, and have difficulty in increasing the diameter thereof compared to materials such as silicon and sapphire, which have already been produced on a large scale.

On the other hand, according to Patent Literature 2 (International Publication No. 2013/035844) and Patent Literature 3 (Japanese Unexamined Patent Application Publication No. 2013-058636), use of a sapphire substrate can increase the quality of a corundum-structured $Al_XGa_YO_3$ ($0 \leq X \leq 2$, $0 \leq Y \leq 2$, $X+Y=2$) thin film, but has difficulty in increasing the quality of a β-galia-structured film. Further, a sapphire substrate cannot pass the current to the base substrate since sapphire is an insulator. This prevents formation of a source electrode or drain electrode on the base substrate, thereby limiting the per-unit area output current of the semiconductor device. Furthermore, the industrial application of sapphire substrates having an increased diameter of 6 or 8 inches has not progressed so much. Accordingly, there is a concern about stable procurement of such sapphire substrates, and the procurement costs thereof are still high.

Further, the low thermal conductivity of gallium oxide and sapphire is an obstacle to increase the heat resistance of semiconductor devices.

Furthermore, the properties of the base substrate cause problems related to electrical properties in realizing low-loss semiconductor devices. For example, to realize high-voltage, low-loss semiconductor devices, it is necessary to reduce the loss in the channel layer, as well as to reduce the loss in layers other than the channel layer. For example, a contact region included in a semiconductor device is required to reduce the loss. For vertical semiconductor devices, it is required to reduce the loss in the base substrate or in the layer between the base substrate and the channel layer.

With the development of mobile phones, information processing terminals have increased their per-unit area throughput. Against this backdrop, semiconductor devices are required to be downsized. There is also a market demand to integrate semiconductor devices having different functions to reduce the semiconductor device count. In particular, there is a strong demand to integrate a semiconductor device containing an InAlGaO-based semiconductor, with a semiconductor device or substrate containing Si, whose industrial application has progressed overwhelmingly. However, such integration requires replacement of the base substrate or the like, regardless of which of a gallium oxide substrate or sapphire substrate, whose crystal growth technology has been established, is used, and therefore is difficult to realize.

Among important applications of InAlGaO-based semiconductors are the base substrates of nitride semiconductors, including GaN, AlN, InN, AlGaN, InGaN, and InAlGaN. Nitride semiconductors are being applied to the light receiving/emitting device field including LEDs or lasers. However, when a sapphire substrate, which is most common, is used as a base substrate in a nitride semiconductor, there occurs in the n-layer, which is a conductive layer, problems such as voltage drop, heating loss, and uneven current distribution. Further, electrodes of both polarities must be formed on the same InAlGaN semiconductor due to the insulation properties of the sapphire substrate and thus, for example, the current density is limited. Further, it is difficult to integrate an LED device into a Si semiconductor device. The technology of forming a nitride semiconductor film on a Si {111} surface is receiving attention thank to its ideas such as disposition of a buffer layer. On the other hand, the technology of forming a nitride semiconductor film on a Si {100} surface, which has been produced on a large scale, has not evolved and therefore its industrial application is still difficult.

According to Patent Literature 3, a gallium nitride crystal can be grown using a β gallium oxide substrate as a base substrate. However, β gallium oxide substrates are limited in their available sizes, and have difficulty in increasing the diameter thereof compared to materials such as silicon and sapphire, which have been produced on a large scale.

According to Non-Patent Literature 2 (IEEE EDL, 30, 1015, 2009), Tomas Palacios et al. at MIT peeled off an AlGaN/GaN thin film grown on a Si {111} and bonded it to a Si {100} substrate, thereby integrating the GaN device with the Si device. However, this method requires many working man-hours and has difficulty in neatly peeling the film from the entire substrate surface.

Non-Patent Literature 3 (WILSON K et al., Electronic, Structural, and Reactive Properties of Ultrathin Aluminum Oxide Films on Pt (111), *The Journal of Physical Chemistry B*, 1998, Vol. 102, P. 1736-1744) describes a multilayer structure in which an alumina thin film is formed on a Pt {111}. Patent Literature 4 (Japanese Unexamined Patent Application Publication No. 2011-192975) discloses a multilayer structure in which a titanium oxide layer (TiOx) is formed on a Pt {111} layer. Patent Literature 5 (Japanese Unexamined Patent Application Publication No. 2011-029399), Patent Literature 6 (Japanese Unexamined Patent Application Publication No. 2012-256850), and Patent Literature 7 (Japanese Unexamined Patent Application Publication No. 2012-256851) disclose multilayer structures in which a ferroelectric film is formed on a base film or lower electrode including Pt {111}. However, any of the alumina thin film of Non-Patent Literature 3, the titanium oxide film of Patent Literature 4, the ferroelectric films (PZT films or the like) of Patent Literature 5 to 7 does not function as a semiconductor and is difficult to use as the semiconductor of a semiconductor device. Accordingly, these films themselves are difficult to use as the semiconductor of a semiconductor device, for example, these films are difficult to use as a conductive base substrate or electrode material by using their conductivity.

As seen, the above multilayer structures for use in semiconductor devices have many problems. Further, they have many problems associated with semiconductor electrical properties as follows: pinning occurs on the interface between the metal layer and semiconductor layer; After forming a film, the Schottky contact is not maintained; vertical conduction is impossible; the illuminance of the semiconductor device varies; luminance and the like are yet to be satisfactory; and there is a limit to increasing the current of the semiconductor device.

Taking the above-mentioned problems into consideration, the objective of the present invention is to provide a crystalline multilayer structure having good semiconductor properties.

In order to achieve the above-mentioned objective, the present inventors have intensively investigated. As the result, they found that a crystalline multilayer structure described below had good electrical properties as follows: the controllability of conductivity was good; and vertical conduction was possible, and that the crystalline multilayer structure could solve all the above-mentioned problems in the art. The crystalline multilayer structure included a metal layer containing a uniaxially oriented metal as a major component and a semiconductor layer disposed directly on the metal layer or with another layer therebetween and containing a crystalline oxide semiconductor as a major component. The crystalline oxide semiconductor contained one or more metals selected from gallium, indium, and aluminum and is uniaxially oriented.

The present inventors also found that if a semiconductor device including the crystalline multilayer structure was applied to an InAlGaO-based semiconductor, the loss in layers other than the channel layer could be reduced; a semiconductor layer could be formed on a base substrate which was cheap and whose diameter could be increased; and a semiconductor layer could be formed on a base substrate having a higher thermal conductivity than β gallium oxide substrates or sapphire substrates and that if a semiconductor device including the crystalline multilayer structure was applied to a nitride semiconductor, use of an InAlGaO-based semiconductor as a base substrate could reduce the loss in layers other than the light-receiving/emitting layer to reduce useless heating; a semiconductor layer could be formed on a base substrate which was cheap and whose diameter could be increased; and integration with a Si semiconductor device was possible.

After obtaining the above findings, the present inventors conducted further examination and then completed the present invention.

That is, the present invention relates to a crystalline multilayer structure including a metal layer containing a uniaxially oriented metal as a major component and a semiconductor layer disposed directly on the metal layer or with another layer therebetween and containing a crystalline oxide semiconductor as a major component, wherein the crystalline oxide semiconductor contains one or more metals selected from gallium, indium, and aluminum and is uniaxially oriented.

The crystalline multilayer structure of the present invention has good semiconductor properties. In particular, the crystalline multilayer structure has good electrical properties as follows: the controllability of conductivity is good; and vertical conduction is possible.

BRIEF DESCRIPTION OF THE DRAWINGS

FIGS. 15A and 15B are schematic diagrams showing part of a process of manufacturing the SIT of FIG. 8;

FIG. 16 is a diagram schematically showing a preferred example of a Schottky barrier diode (SBD) of the present invention;

FIG. 17 is a diagram schematically showing a preferred example of a high-electron-mobility transistor (HEMT) of the present invention;

DESCRIPTION OF EMBODIMENTS

Figure 1:
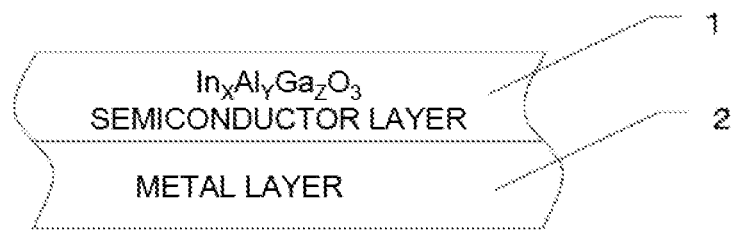
FIG. 1 is a sectional view of a crystalline multilayer structure showing an example of an embodiment of the present invention.

A crystalline multilayer structure of the present invention includes a metal layer containing a uniaxially oriented metal as a major component and a semiconductor layer disposed directly on the metal layer or with another layer therebetween and containing a crystalline oxide semiconductor as a major component.

The metal is not particularly limited as long as it is uniaxially oriented. "Uniaxially oriented metals" include any metal whose crystal orientation is directed to a specific direction (the film thickness and film in-plane directions, film thickness direction, etc.) and includes metals which are oriented preferentially to one axis. In the present invention, the metal is preferably uniaxially oriented in the film thickness direction. The metal is monocrystalline or polycrystalline. When the metal is polycrystalline, the metal includes plural crystal grains each having crystal orientation. The polycrystalline is uniaxially oriented when the crystal orientation of each of these crystal grains is directed to a specific direction. Whether the metal is uniaxially oriented can be checked by X-ray diffraction analysis, for example, in the following way. First, a thin film sample FS, which is a sample at issue, and a randomly oriented powder sample PS of the same crystal are prepared. Then, with respect to the thin film sample FS, there is obtained a ratio (F1/F2) of an integrated intensity (F1) for a peak derived from a specific crystal plane CP1 to an integrated intensity (F2) for a peak derived from another crystal plane CP2. Then, with respect to the powder sample PS, there is obtained a ratio (P1/P2) of an integrated intensity (P1) for a peak derived from the specific crystal plane CP1 to an integrated intensity (P2) for a peak derived from another crystal plane CP2. If the ratio (F1/F2) is larger (preferably twice or more larger, more preferably one digit or more larger) than the ratio (P1/P2), the metal can be determined to be uniaxially oriented. Examples of the metal include platinum (Pt), gold (Au), palladium (Pd), silver (Ag), chromium (Cr), copper (Cu), iron (Fe), tungsten (W), titanium (Ti), tantalum (Ta), niobium (Nb), manganese (Mn), molybdenum (Mo), aluminum (Al), and hafnium (Hf) and alloys thereof. In the present invention, the metal is preferably a uniaxially oriented platinum, gold, or palladium, or a metal oriented to a {111} surface, more preferably platinum, gold, or palladium oriented to a {111} surface.

The metal layer is not particularly limited as long as it contains the uniaxially oriented metal as a major component. The metal layer typically contains 50 mol % or more of the metal, preferably contains 80 mol % or more thereof, more preferably contains 90 mol % or more thereof. The metal layer may be a metal substrate or a metal film disposed on a base substrate. The metal layer may be a continuous metal film, non-continuous metal film, or discontinuous metal film. If the metal layer is a metal substrate, the metal substrate is, for example, a metal substrate containing any metal exemplified above as a major component. A more specific example is a metal substrate containing 50 mass % or more (preferably 80 mass % or more, more preferably 90 mass % or more) of one or more metals selected from platinum (Pt), gold (Au), palladium (Pd), silver (Ag), chromium (Cr), copper (Cu), iron (Fe), tungsten (W), titanium (Ti), tantalum (Ta), niobium (Nb), manganese (Mn), and molybdenum (Mo). If the metal layer is a metal film, the metal film is, for example, a metal film containing any metal exemplified above as a major component. A more specific example is a metal film containing 50% or more (preferably 80% or more, more preferably 90% or more) of one or more metals selected from platinum (Pt), gold (Au), palladium (Pd), silver (Ag), chromium (Cr), copper (Cu), iron (Fe), tungsten (W), titanium (Ti), tantalum (Ta), niobium (Nb), manganese (Mn), and molybdenum (Mo). In the present invention, the metal layer is preferably a metal film disposed on a base substrate. The base substrate is not particularly limited as long as the objects of the present invention are not impaired. Examples of the base substrate include sapphire substrates, Si substrates, quartz substrates, aluminum nitride substrates, boron nitride substrates, SiC substrates, glass substrates (including borosilicate glass substrates and crystallized glass substrates), SiGe substrates, and plastic substrates. In the present invention, the base substrate is preferably a c-plane sapphire substrate or a Si (100) substrate. By using such a preferable substrate, the semiconductor properties can be further improved. Note that in the present invention, the metal layer may be used as an electrode in a semiconductor device.

The crystalline oxide semiconductor is not particularly limited as long as it is an oxide semiconductor containing one or more metals selected from gallium, indium, and aluminum and is uniaxially oriented. The "uniaxially oriented oxide semiconductor" is not particularly limited as long as it is an oxide semiconductor whose crystal orientation is a specific direction (the film thickness and film in-plane directions, the film thickness direction, or the like) and may be an oxide semiconductor which is oriented preferentially to one axis. In the present invention, the oxide semiconductor is preferably uniaxially oriented in the film thickness direction. As with the metal layer, whether the oxide semiconductor is uniaxially oriented can be checked by X-ray diffraction analysis, for example, in the following way. First, a thin film sample FS, which is a sample at issue, and a randomly oriented powder sample PS of the same crystal are prepared. Then, with respect to the thin film sample FS, there is obtained a ratio (F1/F2) of an integrated intensity (F1) for a peak derived from a specific crystal plane CP1 to an integrated intensity (F2) for a peak derived from another crystal plane CP2. Then, with respect to the powder sample PS, there is obtained a ratio (P1/P2) of an integrated intensity (P1) for a peak derived from the specific crystal plane CP1 to an integrated intensity (P2) for a peak derived from another crystal plane CP2. If the ratio (F1/F2) is larger (preferably twice or more larger, more preferably one digit or more larger) than the ratio (P1/P2), the oxide semiconductor can be determined to be uniaxially oriented. In the present invention, the uniaxially oriented crystalline oxide semiconductor is preferably a monocrystal. The oxide semiconductor is, for example, $In_XAl_YGa_ZO_3$ where $0 \le X \le 2$, $0 \le Y \le 2$, $0 \le Z \le 2$, and $X+Y+Z=1.5$ to $2.5$. In the present invention, the oxide semiconductor is preferably a gallium-containing oxide semiconductor or corundum-structured or β-galia structured oxide semiconductor, more preferably $\alpha\text{-}Ga_2O_3$ or $\beta\text{-}Ga_2O_3$. By using such a preferable oxide semiconductor along with any preferable metal described above, a crystalline multilayer structure having better electrical properties can be obtained.

The semiconductor layer is not particularly limited as long as it contains a crystalline oxide semiconductor as a major component. It typically contains 50 mol % or more of the crystalline oxide semiconductor, preferably contains 80 mol % or more thereof, more preferably contains 90 mol % or more thereof.

Now, a preferred method for forming an oxide semiconductor thin film will be described with reference to the accompanying drawings. Specifically, there will be described a method for forming, as a metal layer, a platinum, gold, or palladium thin film or substrate, which is a preferred embodiment, and a method for forming an oxide semiconductor thin film using mist CVD. Throughout the drawings, elements having the same reference numerals are the same elements.

1. Formation of Platinum, Gold, or Palladium Thin Film or Substrate

A platinum, gold, or palladium substrate may be a commercially available material. The substrate preferably has a thickness of 100 μm or more for easy handling and to avoid damages in processes such as the film formation process and device process. Furthermore, the film formation surface of the substrate is preferred to be flattened by a method such as chemical polishing. A platinum or gold thin film can be formed using various film forming methods, including spattering, vapor deposition, and plating. To form a sample whose surface orientation is {111}, heating may be performed during or after film formation. Platinum, gold, or palladium may be oriented using thermal energy used when a crystalline oxide semiconductor thin film is formed from at least one of indium, aluminum, and gallium or a combination thereof.

Prior to forming a platinum, gold, or palladium thin film, a silicon oxide, titanium, or nickel layer may be formed as a blocking layer or adherence strengthening layer between the thin film and a base substrate. A blocking layer is formed in order to prevent the base substrate from entering or diffusing through upper layers thereof in processes such as heat treatment. A blocking layer also has an effect of improving the frequency characteristics of a semiconductor device formed in the layers over the blocking layer. By using a metal such as titanium or nickel or a low-resistance metal oxide film such as zinc oxide, tin oxide, ITO, InGaZnO, InO, GaO, or InAlGaO as the blocking layer or adherence strengthening layer, it is possible to connect between platinum, gold, or palladium and the base substrate in a low resistance manner or to provide the connection with ohmic characteristics. In this case, the metal oxide film need not necessarily be uniaxially oriented and may be amorphous or polycrystalline. The material of the adherence strengthening layer is selected based on the material properties, as well as the affinity for the base substrate and is preferably titanium or nickel. A titanium layer or the like can serve as both a blocking layer and adherence strengthening layer.

A method according to a preferred embodiment includes forming a platinum, gold, or palladium thin film on c-plane sapphire by vapor deposition or sputtering. The thickness of the thin film is not particularly limited, but is preferably 500 nm or less, more preferably 50 nm or less.

A method according to another preferred embodiment includes forming a silicon oxide film on a Si {100} surface by thermal oxidation and then forming a platinum, gold, or palladium film on the silicon oxide film by sputtering while performing heating. By heating the formed film, the crystallinity of platinum, gold, or palladium can be further improved.

2. Formation of Oxide Semiconductor Thin Film

<Material>

The material of the crystalline oxide is not particularly limited and may be one of a gallium compound, an indium compound, and an aluminum compound or a combination thereof. A gallium or indium compound may be obtained by serving gallium metal or indium metal as a start material and converting it into a gallium or indium compound immediately before forming a film. There are a great many types of gallium and indium compounds, including organic complexes and halides thereof. As an example, gallium acetylacetonate and indium acetylacetonate can be used as a gallium compound and indium compound, respectively, and aluminum acetylacetonate can be used as an aluminum compound.

The solvent of the raw-material solution is preferably water, hydrogen peroxide water, or organic solvent. A dopant compound may be added to the raw-material solution. Thus, a formed thin film can be provided with conductivity and used as a semiconductor layer.

In forming a thin film (mixed-crystal film) containing two or more metal elements, for example, a thin film having a composition $In_XAl_YGa_ZO_3$ ($0 \le X \le 2$, $0 \le Y \le 2$, $0 \le Z \le 2$, $X+Y+Z=1.5$ to $2.5$, and at least two of X, Y, and Z are greater than 0), two or more metal compounds may be dissolved in one raw-material solution, or separate raw-material solutions may be provided for the respective metal compounds and then atomized separately.

Note that the expression $In_XAl_YGa_ZO_3$ is used in the present specification to represent the ratio between metal ions and oxygen ions. As is apparent from the fact that there is no expression such as "X+Y+Z=2", $In_XAl_YGa_ZO_3$ also includes a non-stoichiometric oxide, which includes a metal-deficient oxide and a metal-excess oxide, as well as an oxygen-deficient oxide and an oxygen-excess oxide.

<Atomization>

Typical methods for atomizing a raw-material solution into raw-material fine particles include, but not limited to, a method of applying ultrasonic vibration to a raw-material solution to obtain fine particles. Other methods may be used, for example, raw-material fine particles may be formed by spraying a raw-material solution.

<Carrier Gas>

The carrier gas is, for example, nitrogen and may be a gas, such as argon, oxygen, ozone, or air. The flow rate of the carrier gas is not particularly limited and is, for example, 0.1 to 50 L/min. If an organic solvent is used in the raw-material solution, a gas such as oxygen or ozone, including the oxygen element, is preferably used.

<Film Forming Chamber, Sample to be Deposited, Film Formation>

The raw-material fine particles are carried into the film forming chamber by the carrier gas and then are caused to react there. Thus, a thin film is formed on a sample used as the base substrate (hereinafter referred to as "base sample") placed in the chamber. The thin film formed on the base sample is an oxide crystal (preferably, oxide monocrystal) thin film.

The film forming chamber is not particularly limited in configuration or material as long as it is space for forming thin films. As shown in an Example below, the film forming chamber is configured, for example, to receive a carrier gas containing raw-material fine particles from one end of a quartz tube and to discharge an exhaust gas from the other end thereof. In this configuration, the base sample may be placed in such a manner that the film forming surface thereof is horizontal or may be placed in such a manner that the film forming surface is inclined, for example, at 45 degrees with respect to the carrier gas source. The film forming method may be, for example, the fine channel method, in which a channel of several mm or less is used as a reaction area, the linear source method, in which a linear nozzle is disposed on a substrate; a mist (and a carrier gas) is perpendicularly sprayed on the substrate from the nozzle; and the nozzle is moved in a direction perpendicular to a linear outlet, or combinations or derivatives of multiple methods. The fine channel method allows for formation of uniform thin films and improvements in the utilization efficiency of the raw material, while the linear source method allows for continuous film formation on a future large-area substrate and by roll-to-roll. The temperature of the internal space of the film forming chamber can be raised to a predetermined temperature, for example, by disposing a heater around the chamber. The pressure in the film forming chamber may be increased or reduced.

The heating temperature of the film forming chamber during film formation is not particularly limited as long as the temperature can cause the raw-material solute (gallium compound, indium compound, or the like) included in the raw-material solution to chemically react. The heating temperature is, for example, 300 to 1500° C., preferably 400 to 700° C., more preferably 450 to 550° C. This is because too low a heating temperature reduces the reaction speed of the raw-material solute and thus reduces the film forming speed; too high a heating temperature increases the etching speed of a formed thin film and thus reduces the film forming speed. More specifically, the heating temperature is, for example, 300, 350, 400, 450, 500, 550, 600, 650, 700, 750, 800, 900, 1000, or 1500° C., or may be between any two of the values presented. Note that a high film forming temperature is more likely to grow a β-phase and therefore if a corundum-structured (α-single phase) oxide semiconductor thin film is desired, the conditions such as the concentration and composition of the solution and the flow rate during film formation must be optimized for each temperature. The oxide semiconductor thin film may be either a single metal oxide crystal film or a mixed-crystal film. A mixed-crystal film is formed by generating a mist from a solution 30a where two or more solutes are mixed or by simultaneously introducing, into the film forming chamber 16, two or more mists which have been generated separately.

The base sample is not particularly limited as long as a platinum, gold, or palladium thin film or substrate, preferably a thin film or substrate oriented to the surface orientation, for example, {111} can be formed thereon. If a platinum, gold, or palladium thin film is formed, one of a Si substrate, a glass substrate, and a sapphire substrate is preferably used as a base substrate. As a Si substrate, a {100} substrate is particularly preferable, but a {111} substrate may be used. Other preferred examples of the base sample include corundum-structured thin films or substrates, thin films or substrates having a hexagonal crystal structure, typified by GaN or ZnO, thin films or substrates having a cubic crystal structure, typified by YSZ, β-phase gallium oxide thin films or substrates, and γ-phase gallium oxide thin films or substrates. Preferably, an amorphous oxide is formed between the platinum, gold, or palladium thin film and the base substrate. If a conductive amorphous oxide is formed, it may be possible to form an electrode on the base substrate to reduce the area of the semiconductor device.

A buffer layer may be disposed between the platinum, gold, or palladium thin film or substrate and the oxide semiconductor thin film containing at least one of indium, aluminum, and gallium. The buffer layer may be an oxide having a different composition from the oxide semiconductor thin film. The buffer layer is formed between the platinum, gold, or palladium thin film and the oxide semiconductor thin film. The buffer layer is formed, for example, at a low temperature. By forming a buffer layer, an oxide semiconductor thin film can be formed with the surface of platinum, gold, or palladium maintained in a good state. In another example, the buffer layer may be a metal thin film such as titanium, which has a low work function, or a metal oxide thin film such as zinc oxide, indium oxide, ITO, or InGaZnO so that the contact resistance with platinum or gold is reduced. The buffer layer may have a corundum structure, β-galia structure, or bixbyite structure, but preferably has the same crystal structure as the oxide semiconductor thin film layer.

FIGS. 1 to 6 each show an example of a semiconductor device or crystal which can be manufactured using a method of the present embodiment.

In the example of FIG. 1, a semiconductor layer 1 of $In_XAl_YGa_ZO_3$ ($0 \leq X \leq 2$, $0 \leq Y \leq 2$, $0 \leq Z \leq 2$, $X+Y+Z=1.5$ to $2.5$) is formed on a metal layer 2 which is a thin film or a substrate of platinum, gold, or palladium. The semiconductor layer 1 may be a monocrystalline film.

Figure 2:
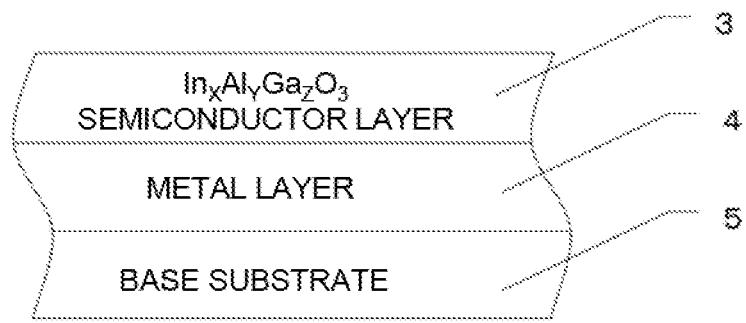
FIG. 2 is a sectional view of a crystalline multilayer structure showing another example of the embodiment of the present invention.

In the example of FIG. 2, a metal layer 4 which is a thin film or a substrate of platinum, gold, or palladium is formed on a base substrate 5 and then a semiconductor layer 3 of $In_XAl_YGa_ZO_3$ ($0 \leq X \leq 2$, $0 \leq Y \leq 2$, $0 \leq Z \leq 2$, $X+Y+Z=1.5$ to $2.5$) is formed on the metal layer 4. The metal layer 4 include platinum, gold, or palladium which is preferably oriented, more preferably oriented to with respect to the {111} surface. The base substrate 5 is preferably a Si substrate, sapphire substrate, or glass substrate and may be a metal substrate such as Cu.

Figure 3:
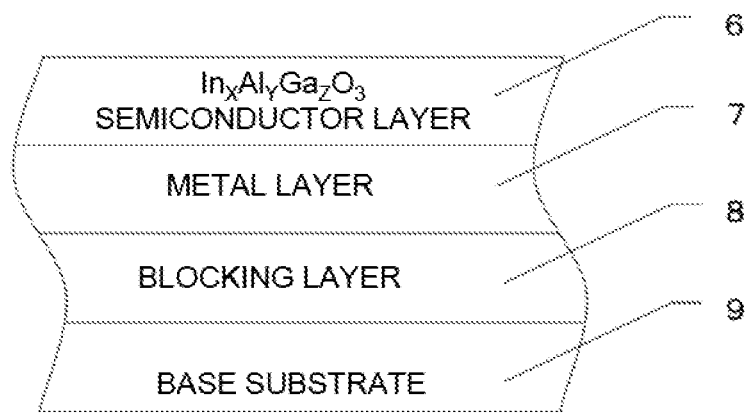
FIG. 3 is a sectional view of a crystalline multilayer structure showing another example of the embodiment of the present invention.

In the example of FIG. 3, a blocking layer 8 is formed between a metal layer 7, which is a thin film or a substrate of platinum, gold, or palladium and a base substrate 9. The blocking layer 8 is formed in order to prevent the base substrate 9 from entering or diffusing through the metal layer 7 and is preferably titanium or silicon oxide. Thus, it is possible to form a semiconductor layer 6 of $In_XAl_YGa_ZO_3$ ($0 \leq X \leq 2$, $0 \leq Y \leq 2$, $0 \leq Z \leq 2$, $X+Y+Z=1.5$ to $2.5$) while preventing base substrate-derived impurities from entering the semiconductor layer 6.

Figure 4:
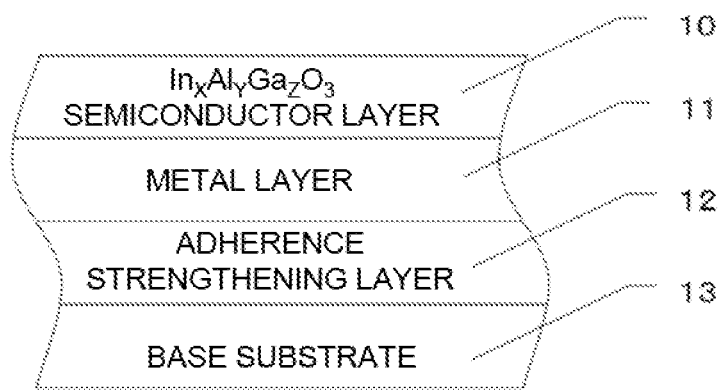
FIG. 4 is a sectional view of a crystalline multilayer structure showing another example of the embodiment of the present invention.

In the example of FIG. 4, an adherence strengthening layer 12 is formed between a metal layer 11 which is a thin film or a substrate of platinum, gold, or palladium and a base substrate 13. The adherence strengthening layer 12 is formed in order to strengthen the adherence between the base substrate 13 and the metal layer 11 and is preferably titanium or nickel.

Figure 5:
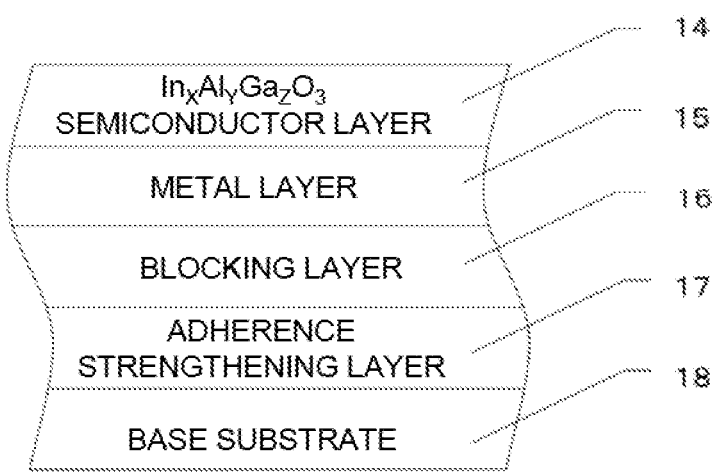
FIG. 5 is a sectional view of a crystalline multilayer structure showing another example of the embodiment of the present invention.

In the example of FIG. 5, a blocking layer 16 and an adherence strengthening layer 17 are formed between a metal layer 15 which is a thin film or a substrate of platinum, gold, or palladium and a base substrate 18.

The blocking layer 16 and adherence strengthening layer 17 may be formed in a vertically reversed manner. If the adherence strengthening layer 17 is formed on the blocking layer 16, it is preferable that the adherence strengthening layer 17 does not react with the metal layer 15 in the film forming process or post-film forming processes. This is because such a reaction would cause the adherence strengthening layer 17 to mix with the metal layer 15, thereby preventing formation of a good semiconductor layer 14 of $In_XAl_YGa_ZO_3$ ($0 \leq X \leq 2$, $0 \leq Y \leq 2$, $0 \leq Z \leq 2$, $X+Y+Z=1.5$ to $2.5$). It is also preferable that the blocking layer 16 and base substrate 18 strongly adhere to each other.

Figure 6:
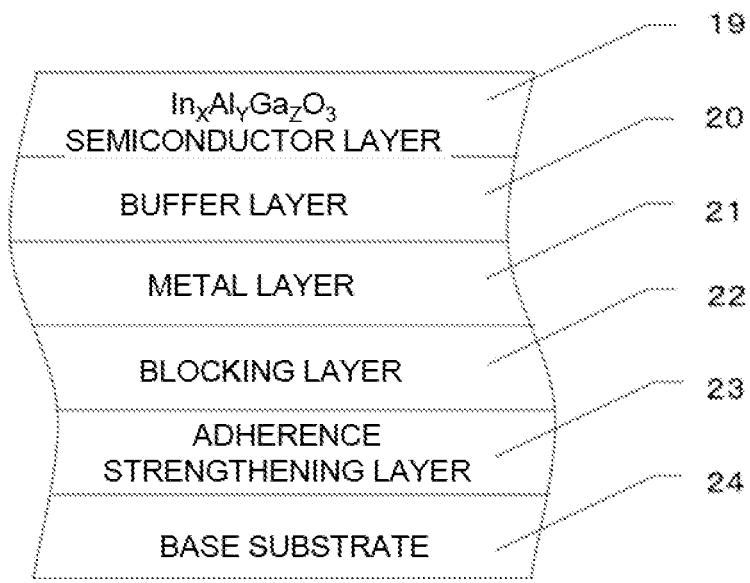
FIG. 6 is a sectional view of a crystalline multilayer structure showing another example of the embodiment of the present invention.

In the example of FIG. 6, a buffer layer 20 is formed between an semiconductor layer 19 of an oxide semiconductor thin film and a metal layer 21 which is a thin film or a substrate of platinum, gold, or palladium.

<Taking Out>

After forming the oxide semiconductor thin film, the base substrate to which the oxide semiconductor thin film adheres is taken out from the film forming chamber.

If an oxide semiconductor thin film is used as a base substrate of a nitride semiconductor such as a GaN, AlN, InN, AlGaN, InGaN, or InAlGaN semiconductor, the nitride semiconductor film is formed by a film forming process such as MOCVD. By nitriding the outermost surface of the oxide semiconductor thin film before forming the nitride semiconductor film, the crystal quality of the nitride semiconductor such as InAlGaN can be improved. The nitriding process may be performed using nitrogen plasma treatment or a method of performing high-temperature annealing while feeding an ammonia gas.

Further, a corundum-structured oxide semiconductor thin film can be grown at low temperature, as well as can be integrated with Si {100} or the like at low temperature. Thus, it is possible to reduce the heat damage of the material, thin film, and semiconductor device not having a corundum structure and formed on the same substrate as the corundum-structured oxide semiconductor thin film. Note that if heat energy is required to form a nitride semiconductor layer, a phase transition prevention method may be performed to maintain the corundum structure. Examples of such a method include disposition of a low-temperature buffer layer for the nitride semiconductor.

Examples of a method for preventing or controlling phase transition will be described below.

As an example, by forming an oxide semiconductor thin film having a higher Al concentration as an upper layer of the oxide semiconductor thin film, it is possible to prevent or control the phase transition of the corundum-structured oxide semiconductor (preferably, InAlGaO-based semiconductor) thin film.

As another example, the film-forming temperature of a nitride semiconductor layer is preferably reduced to a low temperature at which the phase transition of the corundum-structured oxide semiconductor thin film, which is a base substrate, does not occur. Specifically, if the corundum-structured oxide semiconductor thin film is an InAlGaO-based semiconductor, the film-forming temperature is preferably reduced to 800° C. or less, although the temperature depends on the Al concentration. In particular, if the corundum-structured oxide semiconductor thin film is a gallium oxide semiconductor, the film-forming temperature is preferably reduced to 500° C. or less.

As yet another example, a low-temperature buffer layer of a nitride semiconductor may be disposed between the nitride semiconductor layer such as an InAlGaN semiconductor and an InAlGaO semiconductor layer. In this case, it is possible to reduce the film-forming temperature during interface formation to or below the phase transition temperature of the corundum-structured oxide semiconductor thin film so that the interface between the oxide semiconductor thin film and the nitride semiconductor can be maintained in a good state. In this case, it is preferred that the nitride semiconductor layer on the low-temperature buffer layer is formed at a temperature lower than the phase transition temperature of the corundum-structured oxide semiconductor thin film.

Note that, in the present invention, phase transition may be prevented or controlled as described above or may be caused without using the above-mentioned phase transition prevention or control methods or the like. An example of a phase transition is the transition from a corundum structure into a β-galia structure.

While the oxide semiconductor thin film is formed using mist CVD in the above embodiment, other methods may be used. Use of mist CVD allows for formation of an oxide semiconductor thin film at a relatively low temperature. Accordingly, this method is advantageous in that platinum or gold is less likely to migrate and the differences among the thermal expansion coefficients of the respective materials are less likely to become problematic. Other methods for forming an oxide semiconductor thin film include a metal organic chemical vapor deposition method, a molecular beam epitaxy method, a sputtering method, and a vapor deposition method, and a post-film formation heating treatment may be performed as appropriate. The post-film formation heating treatment may be replaced with heating treatment in a process which is included in the subsequent manufacturing process and whose direct object is not formation of an oxide semiconductor thin film, an improvement in crystallinity, or the like.

In the present invention, the oxide semiconductor thin film, buffer layer, blocking layer, and nitride semiconductor layer may be doped with elements other than indium, aluminum, and gallium, and these layers may be made of mixed crystals. For example, elements such as Ge, Sn, Si, Zn, or Mg may be used as doping impurities, and the blocking layer and oxide semiconductor layer may be made of a mixed crystal such as InGaZnO. Thus, the conductivity and insulation properties can be adjusted.

Further, in the present invention, a predetermined repeated structure with respect to the film composition and the concentration of the doping element may be introduced to part of the oxide semiconductor layer, the buffer layer, the blocking layer, or the metal layer. Thus, it is possible to facilitate stress relaxation or adjust the carrier concentration, the carrier mobility, the adherence, and the degree of prevention of entry of other layers (the degree of blocking).

After the above-mentioned film forming process, a device process, including ion implantation, etching, photolithography, heating treatment, and electrode formation may be performed in order to produce a semiconductor device.

Subsequently, the layers, including the metal layer, can also be used in a base substrate peeling technique. For example, upper layers formed on the metal layer of platinum or gold may be fixed to a support substrate and peeled off from the base substrate by dissolving the metal layer in a chemical solution or the like. In this case, an appropriate chemical solution to dissolve the metal layer must be selected so as not to dissolve the upper layers fixed to the support substrate.

The crystalline multilayer structure of the present invention is useful for various types of semiconductor devices, particularly for power devices. Semiconductor devices are categorized into lateral devices, where an electrode is formed on one side of a semiconductor layer, and vertical devices, where electrodes are formed on both front and back sides of a semiconductor layer. The crystalline multilayer structure of the present invention can be suitably used in both lateral devices and vertical devices, particularly in vertical devices. Examples of a semiconductor device include Schottky barrier diodes (SBDs), metal semiconductor field-effect transistors (MESFETs), high-electron-mobility transistors (HEMTs), metal oxide semiconductor field-effect transistors (MOSFETs), static induction transistors (SITs), junction field-effect transistors (JFETs), insulated gate bipolar transistors (IGBTs), and light-emitting diodes. The semiconductor device of the present invention is preferably the SBDs, the MOSFETs, or the SITs. The semiconductor device of the present invention preferably does not include a p-type semiconductor layer.

The crystalline multilayer structure of the present invention may be used in a semiconductor device as it is, or may be used in a semiconductor device, for example, after peeling off the substrate thereof.

Hereafter, preferred examples in which the crystalline oxide semiconductor thin film of the crystalline multilayer structure of the present invention is used as an n-type semiconductor layer ($n^+$-type semiconductor or $n^-$-type semiconductor) will be described with reference to the drawings. However, the present invention is not limited to these examples. Semiconductor devices described below may include other layers (e.g., an insulator layer, a semi-insulator layer, a conductor layer, a semiconductor layer, a buffer layer, or other intermediate layers) or the like as long as the objects of the present invention are not impaired. Further, a buffer layer or the like may be omitted from those semiconductor devices, if necessary.

SBD

Figure 7:
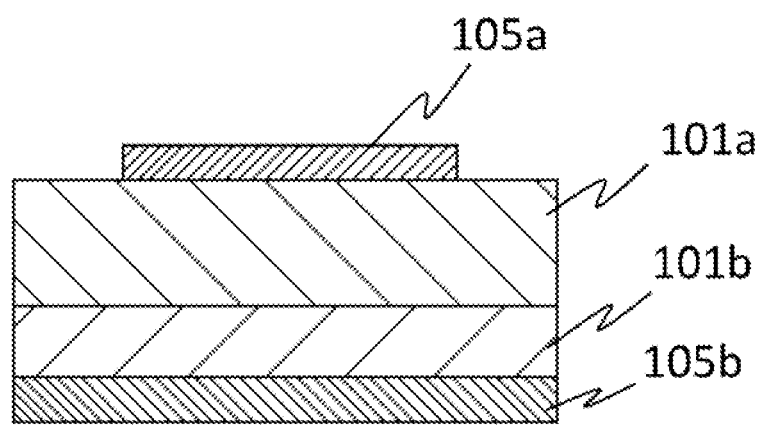
FIG. 7 is a diagram schematically showing a preferred example of a Schottky barrier diode (SBD) of the present invention.

FIG. 7 shows an example of a Schottky barrier diode (SBD) of the present invention. The SBD in FIG. 7 includes an $n^-$-type semiconductor layer 101a, an $n^+$-type semiconductor layer 101b, a Schottky electrode 105a, and an ohmic electrode 105b.

The material of the Schottky and ohmic electrodes may be any electrode material known in the art. Examples of such an electrode material include metals, including Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

The Schottky and ohmic electrodes can be formed by known method such as a vacuum evaporation method or a sputtering method. For example, the Schottky electrode can be formed by laminating a Mo layer and an Al layer and then patterning the MO and Al layers using photolithography.

When a reverse bias is applied to the SBD in FIG. 7, a depletion layer (not shown) spreads in the $n^-$-type semiconductor layer 101a, thereby making the SBD a high-voltage SBD. When a forward bias is applied, electrons flow from the ohmic electrode 105b to the Schottky electrode 105a. As seen above, the SBD using the crystalline multilayer structure is excellent for high-voltage and large-current use and has a fast switching speed, good withstand voltage characteristics, and high reliability.

Figure 8:
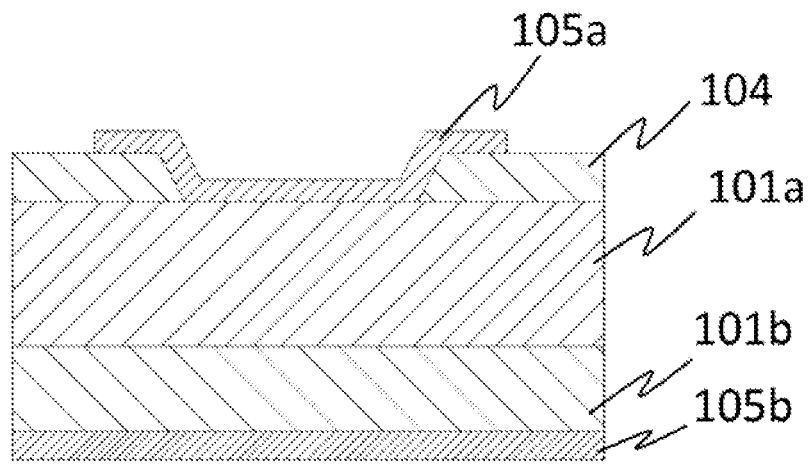
FIG. 8 is a diagram schematically showing a preferred example of a Schottky barrier diode (SBD) of the present invention.

FIG. 8 shows another example of a Schottky barrier diode (SBD) of the present invention. The SBD in FIG. 8 includes the elements of the SBD in FIG. 7, as well as an insulator layer 104. More specifically, the SBD in FIG. 8 includes an $n^-$-type semiconductor layer 101a, an $n^+$-type semiconductor layer 101b, a Schottky electrode 105a, an ohmic electrode 105b, and the insulator layer 104.

The material of the insulator layer 104 is, for example, GaO, AlGaO, InAlGaO, AlInZnGaO$_4$, AlN, Hf$_2$O$_3$, SiN, SiON, Al$_2$O$_3$, MgO, GdO, SiO$_2$, or Si$_3$N$_4$, but is, in the present invention, preferably a corundum-structured insulator. By using a corundum-structured insulator as the insulator layer, the semiconductor properties can be favorably exhibited on the interface. The insulator layer 104 is disposed between the $n^-$-type semiconductor layer 101a and the Schottky electrode 105a. The insulator layer can be formed by known method such as a sputtering method, a vacuum evaporation method, a CVD method or the like.

The forming method, material, and the like of the Schottky and ohmic electrodes are the same as or similar to those of the SBD in FIG. 7.

The SBD in FIG. 8 has better insulation properties and higher current controllability than the SBD in FIG. 7.

Figure 28:
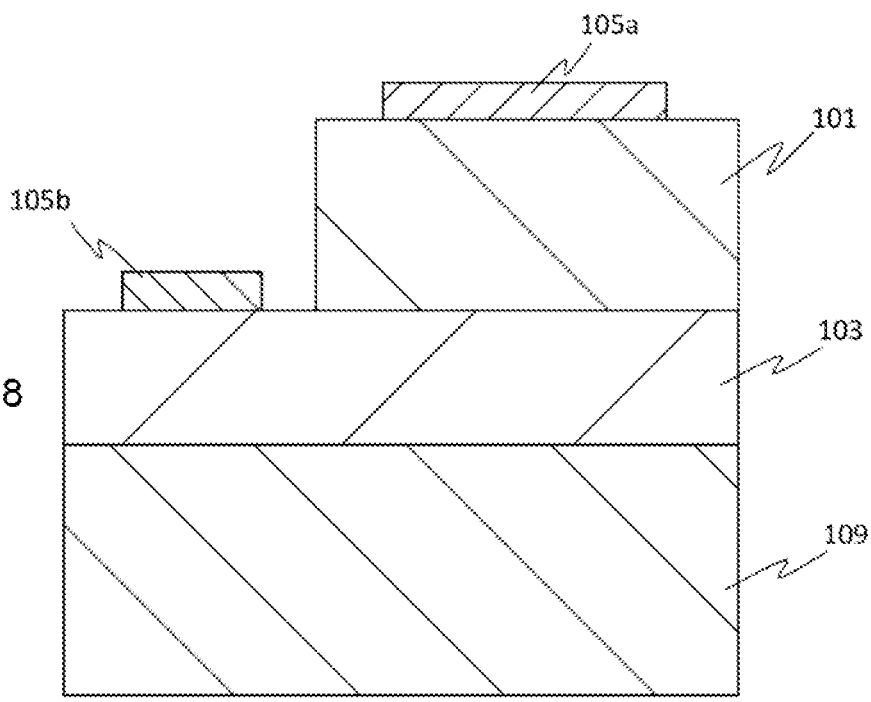
FIG. 28 is a diagram schematically showing a preferred example of a Schottky barrier diode (SBD) of the present invention.

FIG. 28 shows yet another example of a Schottky barrier diode (SBD) of the present invention. The SBD in FIG. 28 includes an n-type semiconductor layer 101, a metal layer 103, a Schottky electrode 105a, an ohmic electrode 105b, and a base substrate 109. Use of the configuration shown in FIG. 28 eliminates the need to enlarge the ohmic electrode to reduce the contact resistance as has been done traditionally, allowing for downsizing the ohmic electrode.

MESFET

Figure 9:
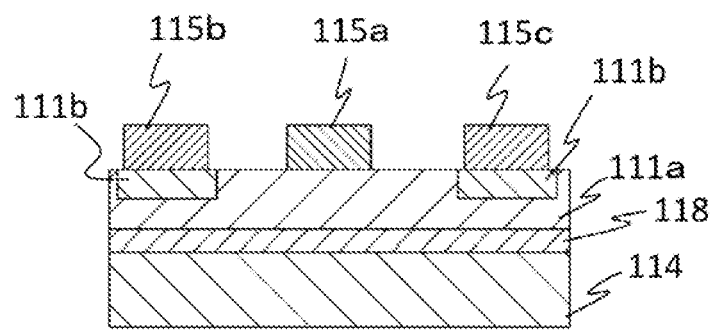
FIG. 9 is a diagram schematically showing a preferred example of a metal semiconductor field-effect transistor (MESFET) of the present invention.

FIG. 9 shows an example of a metal semiconductor field-effect transistor (MESFET) of the present invention. The MESFET in FIG. 9 includes an $n^-$-type semiconductor layer 111a, an $n^+$-type semiconductor layer 111b, a buffer layer 118, a semi-insulator layer 114, a gate electrode 115a, a source electrode 115b, and a drain electrode 115c.

The material of the gate, drain, and source electrodes may be a known electrode material. Examples of such an electrode material include metals, including Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The gate, drain, and source electrodes can be formed by known method such as a vacuum evaporation method, a sputtering method or the like.

The semi-insulator layer 114 only has to be formed of a semi-insulator. Examples of a semi-insulator include those containing a semi-insulator dopant such as ruthenium (Ru) or iron (Fe) and those which have not been doped.

Since the MESFET in FIG. 9 has a favorable depletion layer formed under the gate electrode, it is possible to efficiently control the current flowing from the drain electrode to the source electrode.

HEMT

Figure 10:
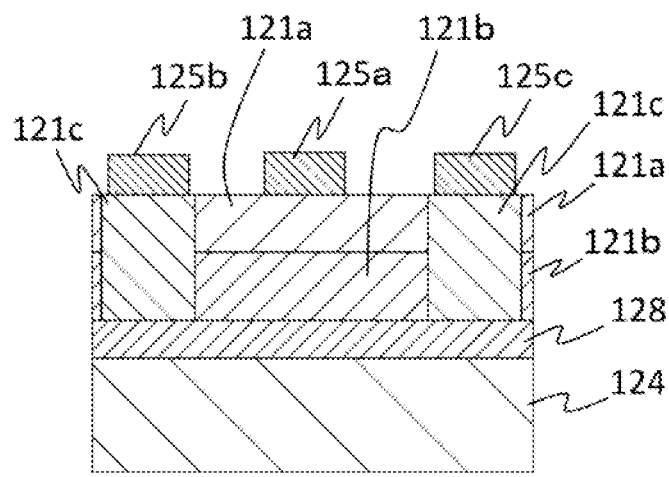
FIG. 10 is a diagram schematically showing a preferred example of a high-electron-mobility transistor (HEMT) of the present invention.

FIG. 10 shows an example of a high-electron-mobility transistor (HEMT) of the present invention. The HEMT in FIG. 10 includes a wide-band-gap n-type semiconductor layer 121a, a narrow-band-gap n-type semiconductor layer 121b, an $n^+$-type semiconductor layer 121c, a buffer layer 128, a semi-insulator layer 124, a gate electrode 125a, a source electrode 125b, and a drain electrode 125c.

The respective materials of the gate, drain, and source electrodes may be known electrode materials. Examples of such electrode materials include metals, including Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The gate, drain, and source electrodes can be formed by known method such as a vacuum evaporation method, a sputtering method or the like.

The n-type semiconductor layer under the gate electrode includes at least the wide-band-gap layer 121a and narrow-band-gap layer 121b. The semi-insulator layer 124 only has to be formed of a semi-insulator. Examples of a semi-insulator include those containing a semi-insulator dopant such as ruthenium (Ru) or iron (Fe) and those which have not been doped.

Since the HEMT in FIG. 10 has a favorable depletion layer formed under the gate electrode, it is possible to efficiently control the current flowing from the drain electrode to the source electrode. In the present invention, if this HEMT has a recess structure, the normally-off characteristics can be achieved.

MOSFET

Figure 11:
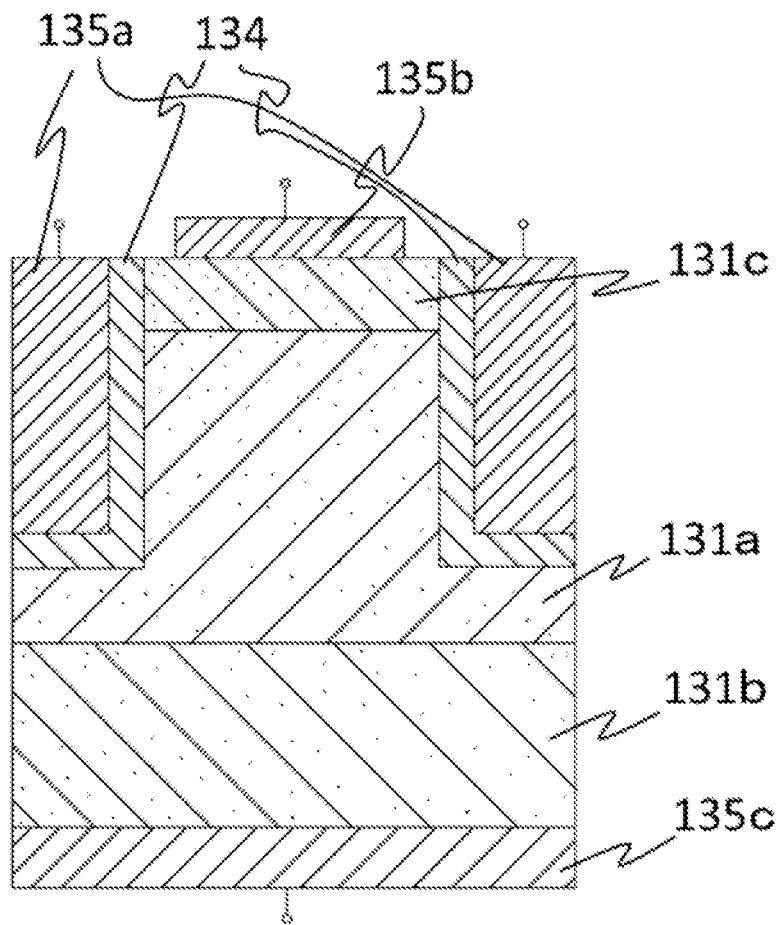
FIG. 11 is a diagram schematically showing a preferred example of a metal oxide semiconductor field-effect transistor (MOSFET) of the present invention.

FIG. 11 shows an example of a MOSFET which is a semiconductor device of the present invention. The MOSFET in FIG. 11 is a trench MOSFET and includes an $n^-$-type semiconductor layer 131a, an $n^+$-type semiconductor layers 131b and 131c, a gate insulating film 134, a gate electrode 135a, a source electrode 135b, and a drain electrode 135c.

The $n^+$-type semiconductor layer 131b which is, for example, 100 nm to 100 μm thick is formed on the drain electrode 135c; the $n^-$-type semiconductor layer 131a which is, for example, 100 nm to 100 μm thick is formed on the $n^+$-type semiconductor layer 131b; the $n^+$-type semiconductor layer 131c is formed on the $n^-$-type semiconductor layer 131a; and the source electrode 135b is formed on the $n^+$-type semiconductor layer 131c.

Multiple trenches are formed so as to penetrate through the $n^+$-type semiconductor layer 131c and halfway through the $n^-$-type semiconductor layer 131a in the depth direction. The gate insulating film 134 having a thickness of, e.g., 10 nm to 1 μm and the gate electrode 135a are embedded in the trenches in this order.

In FIG. 11, when a voltage is applied between the source electrode 135b and the drain electrode 135c and when a positive voltage is applied between the gate electrode 135a and the source electrode 135b, a channel layer is formed on a side of the $n^-$-type semiconductor layer 131a, and electrons are injected into the $n^-$-type semiconductor layer 131a. Thus, the MOSFET is turned on. On the other hand, when the voltage of the gate electrode is set to 0 V, a formation of a channel layer is stopped, and the $n^-$-type semiconductor layer 131a is filled with the depletion layer. Thus, the MOSFET is turned off.

Figure 12A:
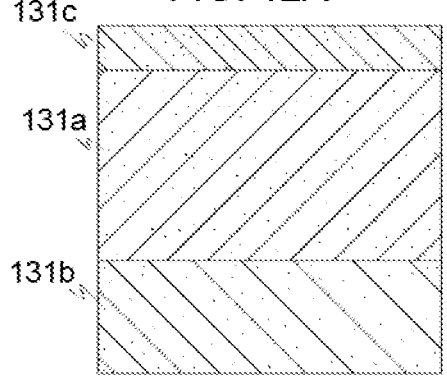
FIGS. 12A and 12B are schematic diagrams showing part of a process of manufacturing the metal oxide semiconductor field-effect transistor (MOSFET) in FIG. 11.
Figure 12B:
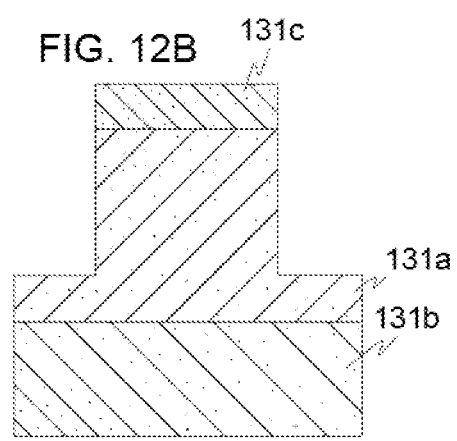

FIGS. 12A and 12B show part of a process of manufacturing the MOSFET in FIG. 11. For example, etching masks are disposed in predetermined regions of an $n^-$-type semiconductor layer 131a and an $n^+$-type semiconductor layer 131c of a multilayer body as shown in FIG. 12A. Then, anisotropic etching is performed by reactive ion etching or the like to form trenches which penetrate through the $n^+$-type semiconductor layer 131c and halfway through the $n^-$-type semiconductor layer 131a in the depth direction, as shown in FIG. 12B. Then, a gate insulating film 134 having a thickness of, e.g., 50 nm to 1 μm is formed on side and bottom surfaces of the trenches using known method such as a thermal oxidation method, a vacuum evaporation method, a sputtering method, a CVD method or the like. Then, a gate electrode material such as polysilicon is formed with a thickness smaller than or equal to that of the $n^-$-type semiconductor layer 131a in the trenches by known method such as CVD, a vacuum evaporation method, a sputtering method, or the like.

Then, a source electrode 135b and a drain electrode 135c are formed on the $n^+$-type semiconductor layer 131c and $n^+$-type semiconductor layer 131b, respectively, by known method such as a vacuum evaporation method, a sputtering method, a CVD method or the like. In this way, a power MOSFET is manufactured. The respective materials of the source and drain electrodes may be known electrode materials. Examples of such electrode materials include metals, including Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

Figure 13:
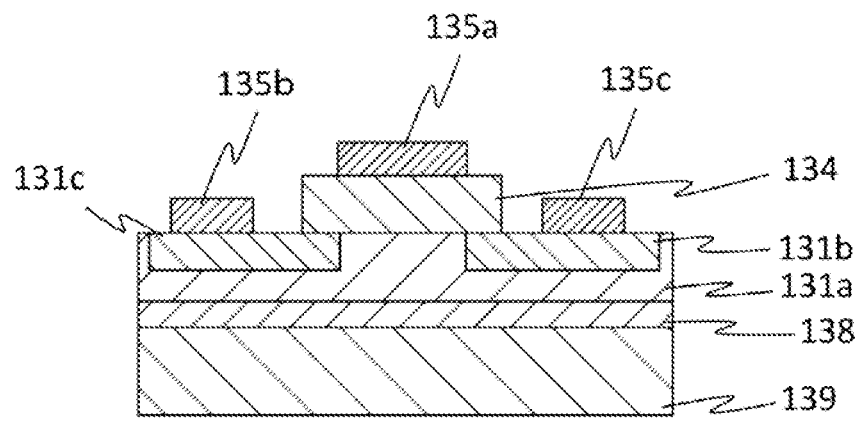
FIG. 13 is a diagram schematically showing an example of a metal oxide semiconductor field-effect transistor (MOSFET) of the present invention.

The MOSFET thus formed has better withstand voltage characteristics than conventional trench MOSFETs. While an example of a vertical trench MOSFET is shown in FIG. 11, the present invention is not limited to this example and is applicable to various forms of MOSFETs. For example, the trenches in FIG. 11 may be dug to a depth such that they reach the bottom of the $n^-$-type semiconductor layer 131a, to reduce the series resistance. FIG. 13 shows an example of a lateral MOSFET. The MOSFET in FIG. 13 includes an $n^-$-type semiconductor layer 131a, a first $n^+$-type semiconductor layer 131b, a second $n^+$-type semiconductor layer 131c, a gate insulating film 134, a gate electrode 135a, a source electrode 135b, a drain electrode 135c, a buffer layer 138, and a semi-insulator layer 139. By embedding the $n^+$-type semiconductor layers 131b, 131c in the $n^-$-type semiconductor layer 131a as shown in FIG. 13, the current can be passed more favorably.

SIT

Figure 14:
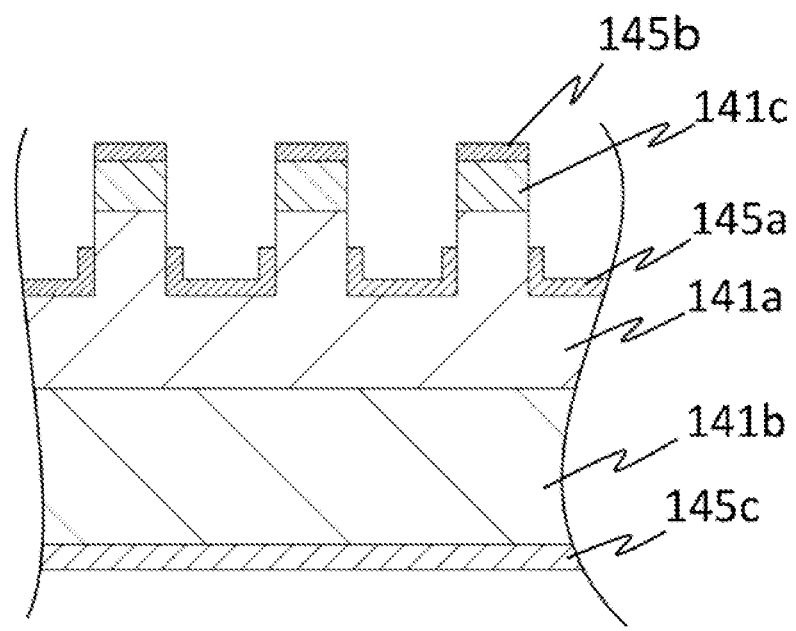
FIG. 14 is a diagram schematically showing a preferred example of a static induction transistor (SIT) of the present invention.

FIG. 14 shows an example of a SIT which is a semiconductor device of the present invention. The SIT in FIG. 14 includes an $n^-$-type semiconductor layer 141a, $n^+$-type semiconductor layers 141b and 141c, a gate electrode 145a, a source electrode 145b, and a drain electrode 145c.

The $n^+$-type semiconductor layer 141b having a thickness of, e.g., 100 nm to 100 μm is formed on the drain electrode 145c; the $n^-$-type semiconductor layer 141a having a thickness of, e.g., 100 nm to 100 μm is formed on the $n^+$-type semiconductor layer 141b; the $n^+$-type semiconductor layer 141c is formed on the $n^-$-type semiconductor layer 141a; and the source electrode 145b is formed on the $n^+$-type semiconductor layer 141c.

Multiple trenches are formed so as to penetrate through the $n^+$-type semiconductor layer 141c and halfway through the $n^-$-type semiconductor layer 141a in the depth direction. The gate electrode 145a is formed on the $n^-$-type semiconductor layer 141a in the trenches.

In FIG. 14, when a voltage is applied between the source electrode 145b and the drain electrode 145c and when a positive voltage is applied between the gate electrode 145a and the source electrode 145b, a channel layer is formed within the $n^-$-type semiconductor layer 141a, and electrons are injected into the n⁻-type semiconductor layer 141a. Thus, the SIT is turned on. On the other hand, when the voltage of the gate electrode is set to 0 V, a formation of a channel layer is stopped, and the n⁻-type semiconductor layer 141a is filled with the depletion layer. Thus, the SIT is turned off.

FIGS. 15A and 15B show part of a process of manufacturing the SIT in FIG. 14. For example, etching masks are disposed in predetermined regions of an n⁻-type semiconductor layer 141a and an n⁺-type semiconductor layer 141c of a multilayer body as shown in FIG. 15A; anisotropic etching is performed using reactive ion etching or the like to form trenches which penetrate through the n⁺-type semiconductor layer 141c and halfway through the n⁻-type semiconductor layer 141a in the depth direction, as shown in FIG. 15B. Then, a gate electrode material such as polysilicon is formed with a thickness smaller than or equal to that of the n⁻-type semiconductor layer 141a in the trenches by a CVD method, a vacuum evaporation method, a sputtering method, or the like. Then, a source electrode 145b and drain electrode 145c are formed on the n⁺-type semiconductor layer 141c and n⁺-type semiconductor layer 141b, respectively, by known means such as vacuum evaporation, sputtering, or CVD. In this way, a SIT is manufactured. The respective materials of the source and drain electrodes may be known electrode materials. Examples of such electrode materials include metals, including Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

Examples of a semiconductor device using no p-type semiconductor have been described above. However, the present invention is not limited to these examples, and a p-type semiconductor may be used in a semiconductor device. FIGS. 16 to 22 each show an example of a semiconductor device using a p-type semiconductor. These semiconductor devices can be manufactured in manners similar to those of the above examples. Note that the p-type semiconductor may be one whose material is the same as that of an n-type semiconductor and which includes a p-type dopant or may be one whose material differs from that of an n-type semiconductor.

FIG. 16 shows an preferred example of a Schottky barrier diode (SBD) including an n⁻-type semiconductor layer 101a, an n⁺-type semiconductor layer 101b, a p-type semiconductor layer 102, a metal layer 103, an insulator layer 104, a Schottky electrode 105a, and an ohmic electrode 105b. The metal layer 103 formed from, for example, a metal such as Al and covers the Schottky electrode 105a. FIG. 17 shows an preferred example of a high-electron-mobility transistor (HEMT) including a wide-band-gap n-type semiconductor layer 121a, a narrow-band-gap n-type semiconductor layer 121b, an n⁺-type semiconductor layer 121c, a p-type semiconductor layer 123, a gate electrode 125a, a source electrode 125b, a drain electrode 125c, and a substrate 129.

Figure 18:
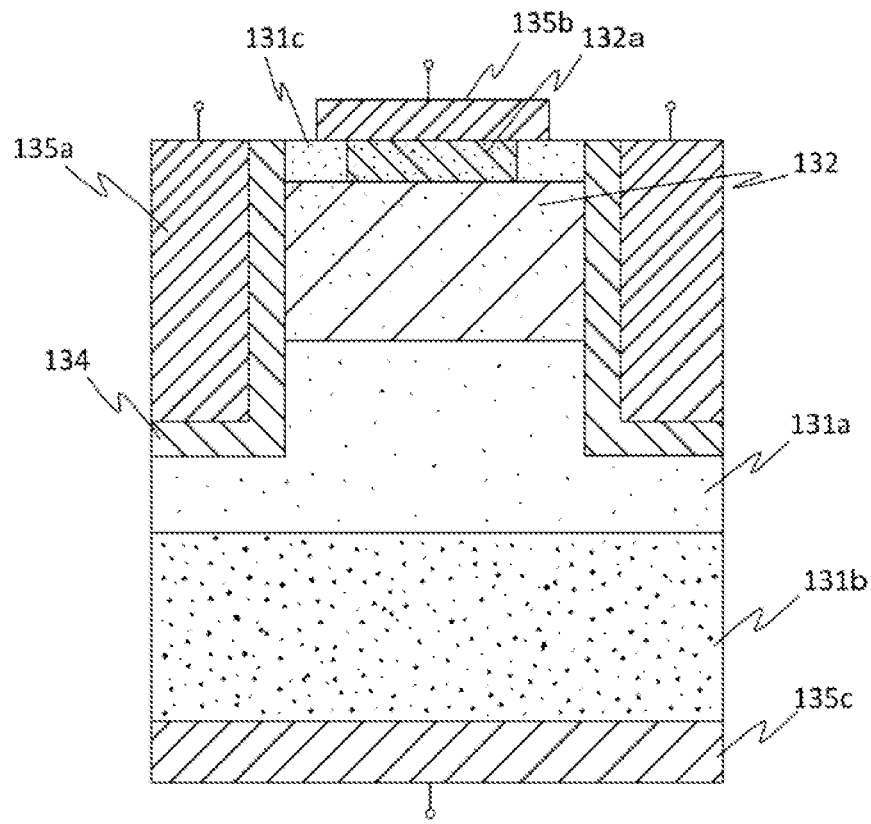
FIG. 18 is a diagram schematically showing a preferred example of a metal oxide semiconductor field-effect transistor (MOSFET) of the present invention.
Figure 19:
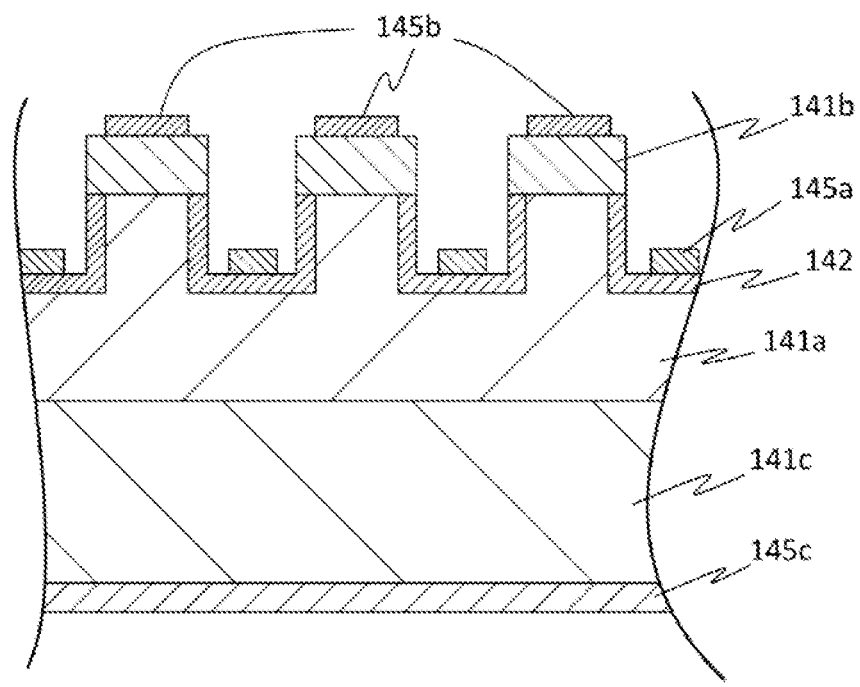
FIG. 19 is a diagram schematically showing a preferred example of a junction field-effect transistor (JFET) of the present invention.
Figure 20:
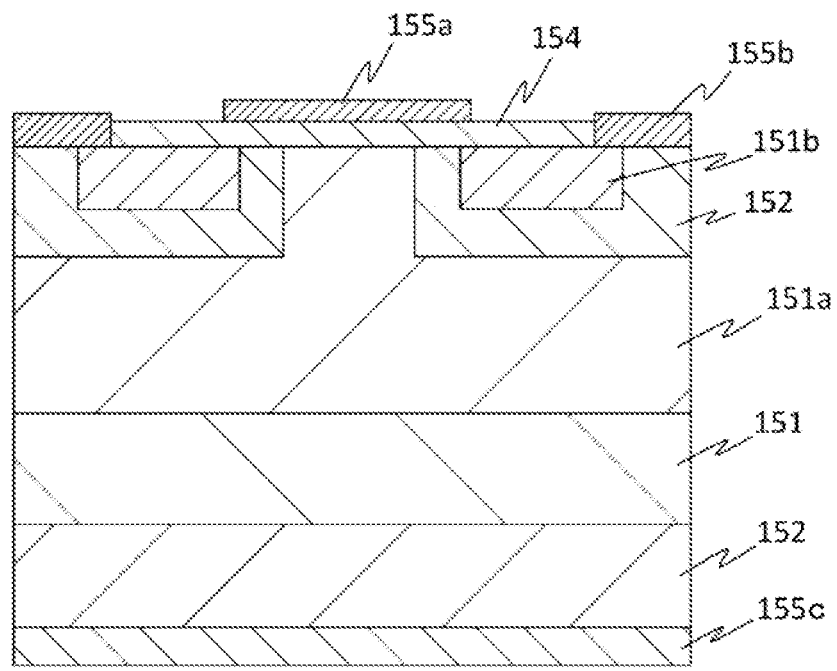
FIG. 20 is a diagram schematically showing a preferred example of an insulated gate bipolar transistor (IGBT) of the present invention.
Figure 21:
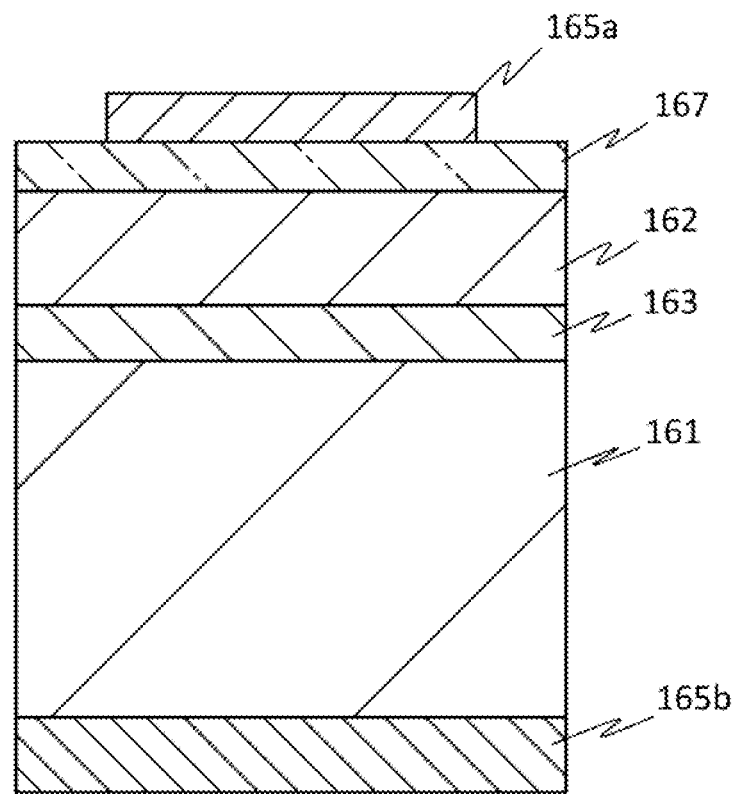
FIG. 21 is a diagram schematically showing a preferred example of a light-emitting diode (LED) of the present invention.

FIG. 18 shows a preferred example of a metal oxide semiconductor field-effect transistor (MOSFET) including an n⁻-type semiconductor layer 131a, a first n⁺-type semiconductor layer 131b, a second n⁺-type semiconductor layer 131c, a p-type semiconductor layer 132, a p⁺-type semiconductor layer 132a, a gate insulating film 134, a gate electrode 135a, a source electrode 135b, and a drain electrode 135c. Note that the p⁺-type semiconductor layer 132a may be a p-type semiconductor layer or may be the same as the p-type semiconductor layer 132. FIG. 19 shows a preferred example of a junction field-effect transistor (JFET) including an n⁻-type semiconductor layer 141a, a first n⁺-type semiconductor layer 141b, a second n⁺-type semiconductor layer 141c, a p-type semiconductor layer 142, a gate electrode 145a, a source electrode 145b, and a drain electrode 145c. FIG. 20 shows a preferred example of an insulated gate bipolar transistor (IGBT) including an n-type semiconductor layer 151, n⁻-type semiconductor layer 151a, n⁺-type semiconductor layer 151b, a p-type semiconductor layer 152, a gate insulating film 154, a gate electrode 155a, an emitter electrode 155b, and a collector electrode 155c. LED FIG. 21 shows an example of a light-emitting diode (LED) which is a semiconductor device of the present invention. In the semiconductor light-emitting device in FIG. 21, an n-type semiconductor layer 161 is laminated on a second electrode 165b; a light-emitting layer 163 is laminated on the n-type semiconductor layer 161; a p-type semiconductor layer 162 is laminated on the light-emitting layer 163; a translucent electrode 167 configured to transmit light emitted by the light-emitting layer 163 is laminated on the p-type semiconductor layer 162; and a first electrode 165a is laminated on the translucent electrode 167. Note that the semiconductor light-emitting device in FIG. 21 may be covered by a protective layer except for the electrodes.

Examples of the material of the translucent electrode include conductive oxide materials containing indium (In) or titanium (Ti). More specific examples include $In_2O_3$, ZnO, $SnO_2$, $Ga_2O_3$, $TiO_2$, $CeO_2$, mixed crystals of two or more thereof, and these materials which are doped. The translucent electrode can be formed from the above materials by known means such as sputtering. The formed translucent electrode may be thermally annealed to provide it with transparency.

In the semiconductor light-emitting device in FIG. 21, when a current is passed through the p-type semiconductor layer 162, the light-emitting layer 163, and the n-type semiconductor layer 161 while using the first electrode 165a as a positive electrode and the second electrode 165b as a negative electrode, the light-emitting layer 163 emits light.

Examples of the material of the first electrode 165a and the second electrode 165b include metals, including Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The method for forming the electrode is not particularly limited, and it is possible to form using any film-forming method and, for example, may be formed using a method which is appropriately selected from among wet methods such as printing and coating, physical methods such as vacuum evaporation, sputtering, and ion plating, chemical methods such as CVD and plasma CVD, and the like considering the suitability for the electrode material.

Figure 22:
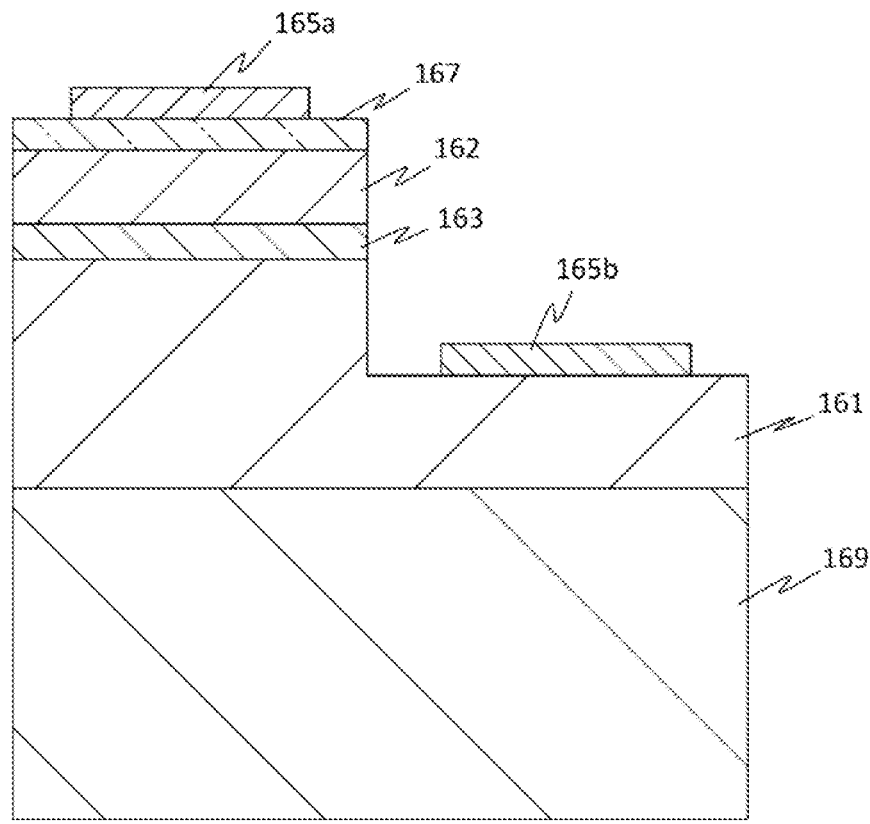
FIG. 22 is a diagram schematically showing a preferred example of a light-emitting diode (LED) of the present invention.

FIG. 22 shows another form of light-emitting device. In the light-emitting device in FIG. 22, an n-type semiconductor layer 161 is laminated on a substrate 169, and a second electrode 165b is laminated on a part of a surface of the n-type semiconductor layer 161 exposed by cutting off respective parts of a p-type semiconductor layer 162, a light-emitting layer 163, and the n-type semiconductor layer 161.

As seen above, by using the crystalline multilayer structure of the present invention to a light-emitting device, it allows for realization of a high-voltage, large-current LED which is less likely to absorb light and has good light extraction properties and high luminance. Further, the light-emitting device shown in FIG. 21 can be reduced in size and weight and improved in light emission efficiency compared to that of FIG. 22.

EXAMPLE

Described below is an Example of the present invention.

1. Experiment 1

1-1. Formation of Base Sample for Deposition

A platinum thin film was formed on a sapphire substrate (available from Namiki Precision Jewel Co., Ltd, c-plane, 0.55 mm thick) using a vapor deposition apparatus and used as a base sample.

In another example, a titanium film was formed with a thickness of 10 nm on a Si {100} substrate (thermal oxide film 100 nm, n-type, 0.525 mm thick) at 600° C. using a sputtering apparatus (EB1100 available from CANON ANELVA CORPORATION) and then a platinum thin film was formed with a thickness of 35 nm using the same sputtering apparatus. The thin film obtained was used as a base sample.

Then, a 35 nm-thick gold thin film was formed on the sapphire substrate or Si {100} substrate serving as a base sample using the vapor deposition apparatus.

1-2. Mist CVD Apparatus

Figure 23:
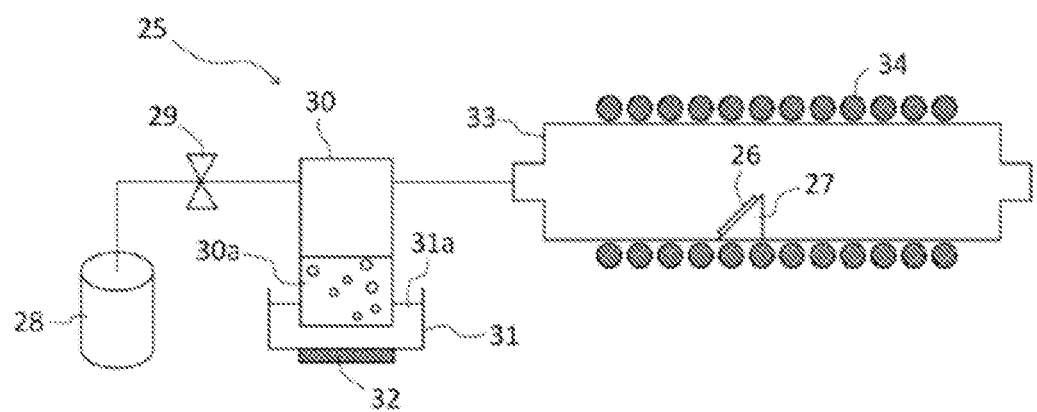
FIG. 23 is a configuration diagram of a film forming apparatus showing an example of the embodiment of the present invention.

First, referring to FIG. 23, a mist CVD apparatus 25 used in this Example will be described. The base samples formed using the methods described in section 1-1 above were used as base samples 26. The mist CVD apparatus 25 includes a sample stage 27 for placing the base sample 26, such as a base substrate, a carrier-gas source 28 for providing a carrier gas, a flow rate control valve 29 for controlling the flow rate of the carrier gas sent from the carrier-gas source 28, a mist source 30 containing a raw-material solution 30a, a container 31 containing water 31a, an ultrasonic transducer 32 attached to the bottom of the container 31, a film forming chamber 33 formed of a quartz tube having an inner diameter of 40 mm, and a heater 34 disposed around the film forming chamber 33. The sample stage 27 is formed of quartz, and the surface thereof for placing the base sample 26 is inclined. By forming both the film forming chamber 33 and sample stage 27 from quartz, entry of apparatus-derived impurities into a thin film formed on the base sample 26 is reduced.

1-3. Preparation of Raw-Material Solution

By dissolving raw-material solutes shown in Table 1 in extra-pure water, a raw-material solution 30a having a desired concentration was prepared.

TABLE 1

| Type of film | Solvent | Solute | Carrier gas |
|---|---|---|---|
| gallium oxide | water | gallium acetylacetonate 0.05 mol/l HCL 1.5% | nitrogen |

1-4. Preparation for Film Formation

Subsequently, a 10 mm-side square, 600 μm-thick base substrate was placed as the base sample 26 on the sample stage 27, and the heater 34 was activated to raise the temperature in the film forming chamber 33 to 500° C. Then, the flow rate control valve 29 was opened to send the carrier gas from the carrier-gas source 29 into the film forming chamber 33. After the carrier gas sufficiently substituted for the atmosphere in the film forming chamber 33, the flow rate of the carrier gas was adjusted to 5 ml/min. A nitrogen gas was used as the carrier gas.

1-5. Formation of Thin Films

Subsequently, the ultrasonic transducer was vibrated at 2.4 MHz so that the vibration was propagated to the raw-material solution 30a through the water 31a. Thus, the raw-material solution 30a was atomized into raw-material fine particles.

The raw-material fine particles were carried into the film forming chamber 33 by the carrier gas and then a thin film was formed by a CVD reaction on the film forming surface of the base sample 26.

1-6. Evaluation

Figure 24:
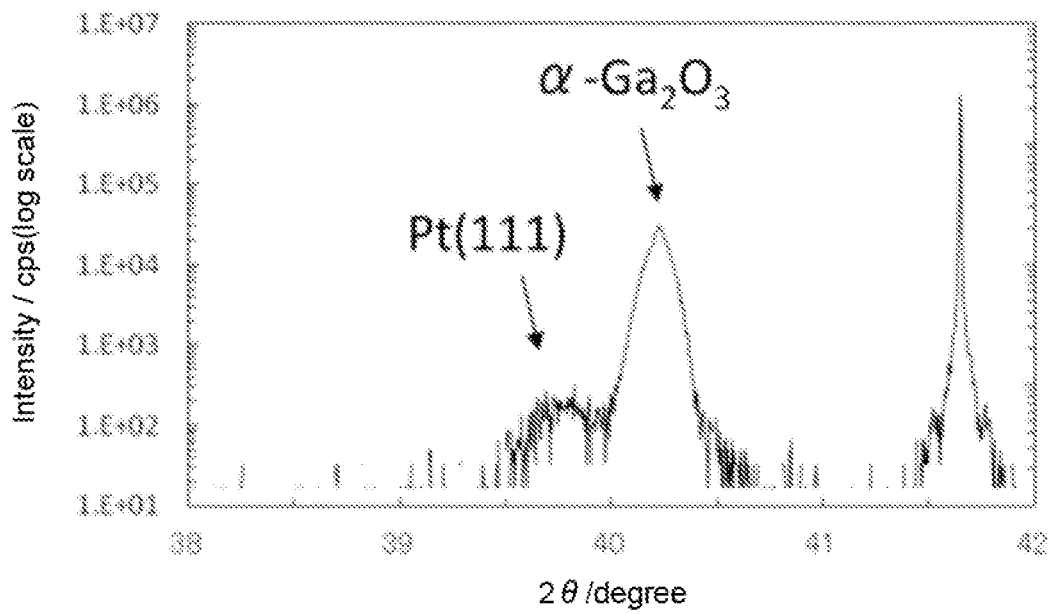
FIG. 24 is a diagram showing an example of an X-ray diffraction profile of an Example of the present invention.
Figure 25:
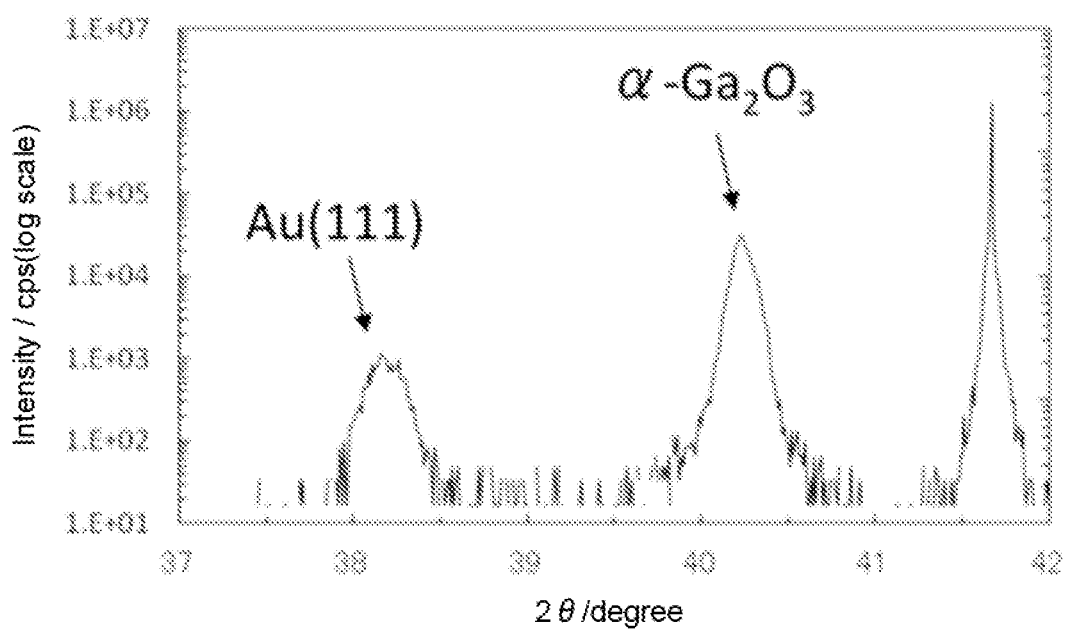
FIG. 25 is a diagram showing an example of an X-ray diffraction profile of the Example of the present invention.

FIGS. 24 to 27 show X-ray diffraction results with respect to the experiment of Table 1. In FIG. 24, by the aforementioned method, platinum was confirmed to be oriented with respect to the {111} surface in the sample formed on the sapphire substrate. In FIG. 25, gold was confirmed to be oriented with respect to the {111} surface in the base sample formed on the sapphire substrate. Further, uniaxially-oriented, corundum-structured gallium oxide ($\alpha$-$Ga_2O_3$) monocrystals were confirmed to be formed on the respective thin films. This result indicates that the platinum and gold thin films were uniaxially oriented and thus the crystalline gallium oxide monocrystalline thin films were formed on the platinum and gold thin films. Further, a gallium oxide thin film was formed on the platinum or gold thin film at 600° C., and the gallium oxide thin film was found to be a n-phase gallium oxide monocrystalline thin film. This platinum or gold thin film was confirmed to have been uniaxially oriented after the formation of the gallium oxide thin film.

Figure 26:
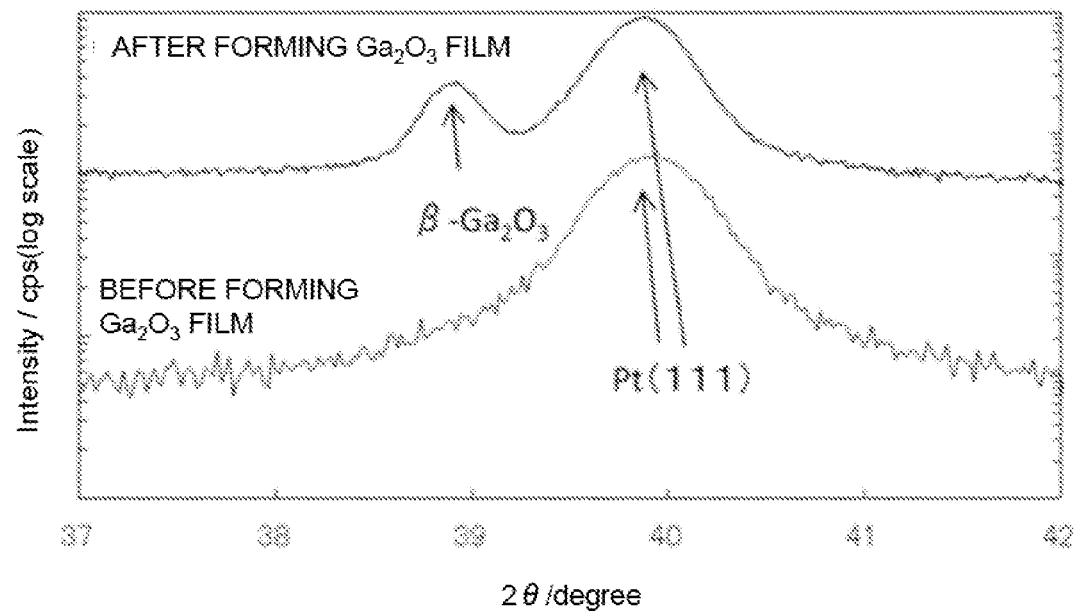
FIG. 26 is a diagram showing an example of an X-ray diffraction profile of the Example of the present invention.

In FIG. 26, a gallium oxide formed, using mist CVD, on the sample obtained by forming a 10 nm-thick titanium thin film and then a 35 nm-thick platinum thin film on the Si {100} substrate (thermal oxide film 100 nm, n-type, 0.525 mm thick) was confirmed to be a $\beta$-galia structured gallium oxide ($\beta$-$Ga_2O_3$) monocrystal. Further, it was found that this platinum thin film had been uniaxially oriented before the gallium oxide film was formed and that the $\beta$-phase gallium oxide monocrystalline thin film was formed on the uniaxially oriented platinum thin film.

Figure 27:
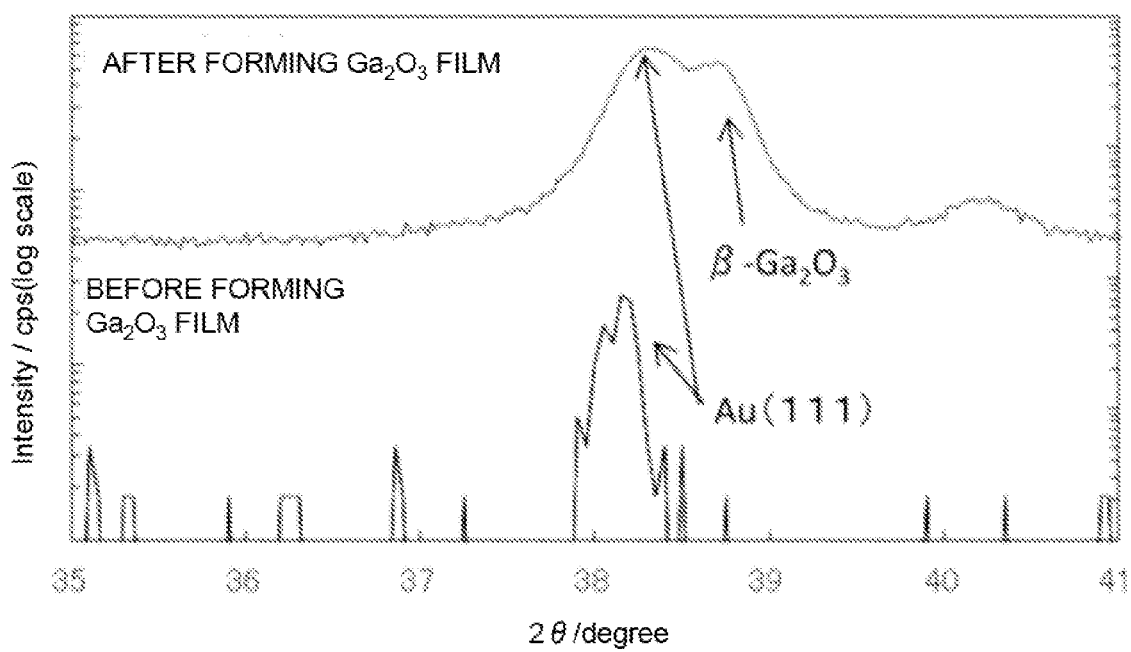
FIG. 27 is a diagram showing an example of an X-ray diffraction profile of the Example of the present invention.

Similarly, in FIG. 27, a gallium oxide formed, using mist CVD, on the sample obtained by forming a 35 nm-thick gold thin film on a Si {100} substrate (thermal oxide film 100 nm, n-type, 0.525 mm thick) using vapor deposition was confirmed to be a $\beta$-galia structured gallium oxide ($\beta$-$Ga_2O_3$) monocrystal. Further, it was found that this gold thin film had been uniaxially oriented before the gallium oxide film was formed and that the $\beta$-phase gallium oxide monocrystalline thin film was formed on the uniaxially oriented gold thin film.

Examinations of the respective Experiments are as follows.

When the gallium oxide films were directly formed on the Si substrates, and more specifically, on the surface orientations {100}, {111}, and {110}, the gallium oxide films became amorphous, that is, no crystalline gallium oxide could be formed. Similarly, when the platinum thin film was directly formed on the Si substrate and then the gallium oxide film was formed thereon, the gallium oxide film became amorphous, that is, no crystalline gallium oxide could be formed. Note that the platinum thin film was not uniaxially oriented even after the gallium oxide film was formed.

Similarly, when the non-uniaxially oriented aluminum film was formed on the sapphire substrate using the above-mentioned sputtering apparatus and then the gallium oxide film was formed thereon, the gallium oxide film became amorphous, that is, no crystalline gallium oxide could be formed.

As seen above, when the platinum or gold thin film had been uniaxially oriented by the time when the oxide semiconductor thin film was formed, the formed oxide semiconductor thin film successfully exhibited good crystallinity.

Similarly, when the uniaxially oriented palladium thin films were formed on the sapphire substrates using the above-mentioned sputtering apparatus and then the gallium oxide films were formed thereon, the α-$Ga_2O_3$ monocrystalline film and β-$Ga_2O_3$ monocrystalline film both having good crystallinity could be obtained.

A crystalline multilayer structure was formed under the same conditions as Experiment 1 except that a 300 nm-thick platinum thin film was formed; gallium bromide was used in place of gallium acetylacetonate; and oxygen was used in place of nitrogen. Then, an ohmic electrode was formed on the oxide semiconductor thin film by pressure-bonding In. In this way, there was formed an SBD using the above platinum thin film as a Schottky electrode.

Figure 29:
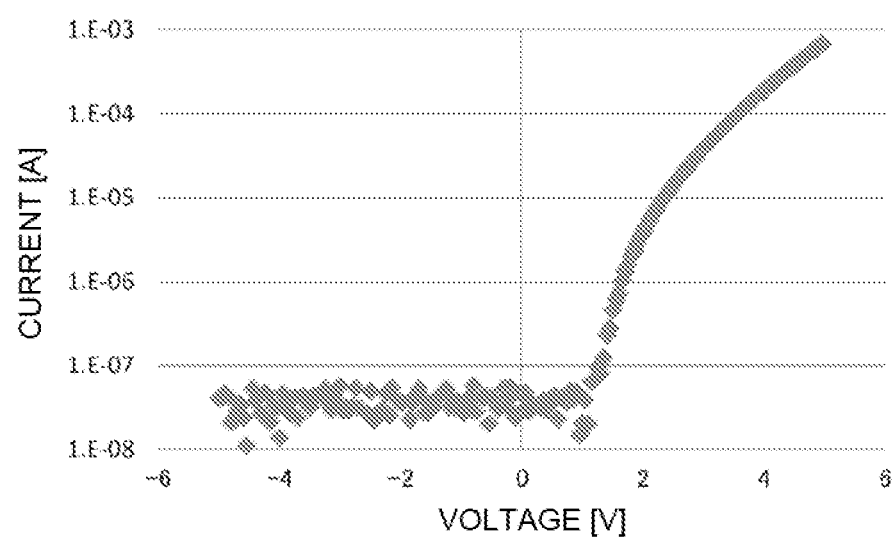
FIG. 29 is a diagram showing IV characteristics evaluation results in the Example of the present invention.

The IV characteristics of the SBD obtained were evaluated. The results are shown in FIG. 29.

The crystalline multilayer structure of the present invention can be used in all fields, including semiconductors (e.g., compound semiconductor electronic devices), electronic components/electric apparatus components, optical/electronic photograph-related devices, and industrial members. Since this crystalline multilayer structure has good semiconductor properties, it is particularly useful for semiconductor devices.

The embodiments of the invention in which an exclusive property or privilege is claimed are defined as follows:

1. A crystalline multilayer structure comprising:
   a metal layer containing a uniaxially oriented metal as a major component; and
   a semiconductor layer disposed directly on the metal layer or with another layer therebetween and containing a crystalline oxide semiconductor as a major component, wherein
   the crystalline oxide semiconductor contains one or more metals selected from gallium, indium, and aluminum,
   the crystalline oxide semiconductor has a corundum structure or β-galia structure and is uniaxially oriented in the film thickness direction.

2. The crystalline multilayer structure of claim 1, wherein the crystalline oxide semiconductor contains gallium.

3. The crystalline multilayer structure of claim 1, wherein the metal is platinum, gold, or palladium.

4. The crystalline multilayer structure of claim 1, wherein the metal layer is a metal film disposed on a base substrate.

5. The crystalline multilayer structure of claim 4, wherein the base substrate is a sapphire substrate, a Si substrate, a quartz substrate, an aluminum nitride substrate, a boron nitride substrate, a SiC substrate, a glass substrate, a SiGe substrate, or a plastic substrate.

6. A semiconductor device comprising the crystalline multilayer structure of claim 1.

7. A semiconductor device comprising:
   the crystalline multilayer structure of claim 1; and
   an electrode disposed directly on the crystalline multilayer structure or with another layer therebetween.

8. A semiconductor device comprising:
   a metal layer containing a uniaxially oriented metal as a major component; and
   a semiconductor layer disposed directly on the metal layer or with another layer therebetween and containing a crystalline oxide semiconductor as a major component, wherein
   the crystalline oxide semiconductor contains one or more metals selected from gallium, indium, and aluminum,
   the crystalline oxide semiconductor has a corundum structure or β-galia structure and is uniaxially oriented in the film thickness direction.

9. The semiconductor device of claim 6, wherein the semiconductor device is a vertical device.

10. The semiconductor device of claim 6, wherein the semiconductor device is a power device.

11. The semiconductor device of claim 6, wherein the semiconductor device is a Schottky barrier diode (SBD), a metal semiconductor field-effect transistor (MESFET), a high-electron-mobility transistor (HEMT), a metal oxide semiconductor field-effect transistor (MOSFET), a static induction transistor (SIT), a junction field-effect transistor (JFET), an insulated gate bipolar transistor (IGBT), or a light-emitting diode (LED).

12. The semiconductor device of claim 6, wherein the semiconductor device is a Schottky barrier diode (SBD), a metal oxide semiconductor field-effect transistor (MOSFET), or a static induction transistor (SIT).

13. The semiconductor device of claim 6, wherein the semiconductor device is a light-emitting diode comprising the crystalline multilayer structure and a light-emitting layer disposed directly on an upper surface or lower surface of the crystalline multilayer structure or with another layer therebetween.

* * * * *